(12) United States Patent
Kaminski et al.

(10) Patent No.: US 10,910,033 B2
(45) Date of Patent: Feb. 2, 2021

(54) REFRESH-RELATED ACTIVATION IN MEMORY

(71) Applicant: Micron Technology, Inc., Boise, ID (US)

(72) Inventors: Stephen Michael Kaminski, Boise, ID (US); Anthony D. Veches, Boise, ID (US); James S. Rehmeyer, Boise, ID (US); Debra M. Bell, Boise, ID (US); Dale Herber Hiscock, Boise, ID (US); Joshua E. Alzheimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 16/220,742

(22) Filed: Dec. 14, 2018

(65) Prior Publication Data
US 2020/0194054 A1    Jun. 18, 2020

(51) Int. Cl.
*G11C 11/406* (2006.01)
*G11C 11/4072* (2006.01)
*G11C 11/4091* (2006.01)

(52) U.S. Cl.
CPC ..... *G11C 11/40611* (2013.01); *G11C 11/4072* (2013.01); *G11C 11/4091* (2013.01); *G11C 11/40618* (2013.01); *G11C 11/40622* (2013.01); *G11C 2211/406* (2013.01)

(58) Field of Classification Search
CPC .............. G11C 11/40611; G11C 11/40618
USPC ........................................... 365/222
See application file for complete search history.

(56) References Cited

U.S. PATENT DOCUMENTS

| | | | | |
|---|---|---|---|---|
| 7,675,800 B2 * | 3/2010 | Kawabata | ............. | G11C 11/406 365/222 |
| 10,061,541 B1 * | 8/2018 | Lee | ................... | G11C 11/40611 |
| 10,141,041 B1 * | 11/2018 | Lee | ................... | G11C 11/40618 |

* cited by examiner

*Primary Examiner* — Son L Mai
(74) *Attorney, Agent, or Firm* — Holland & Hart LLP

(57) ABSTRACT

Methods, systems, and devices for refresh-related activation in memory are described. A memory device may conduct a refresh operation to preserve the integrity of data. A refresh operation may be associated with a refresh time where the memory device is unable to execute or issue any commands (e.g., access commands). By posting (e.g., saving) one or more commands and/or row addresses during the refresh time, the memory device may be configured to execute the saved commands and/or re-open one or more rows associated with the saved row addresses at a later time (e.g., upon completion of the refresh operation). Accordingly, fewer commands may be issued to activate the memory cells after the refresh time.

25 Claims, 11 Drawing Sheets

REFRESH-RELATED ACTIVATION IN MEMORY

BACKGROUND

The following relates generally to a system that includes at least one memory device and more specifically to refresh-related activation in memory.

Memory devices are widely used to store information in various electronic devices such as computers, wireless communication devices, cameras, digital displays, and the like. Information is stored by programming different states of a memory device. For example, binary devices may store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. For example, some memory devices (e.g., some rows of memory cells of a memory device) may use periodic refresh operations to maintain data integrity.

DETAILED DESCRIPTION

Figure 1:
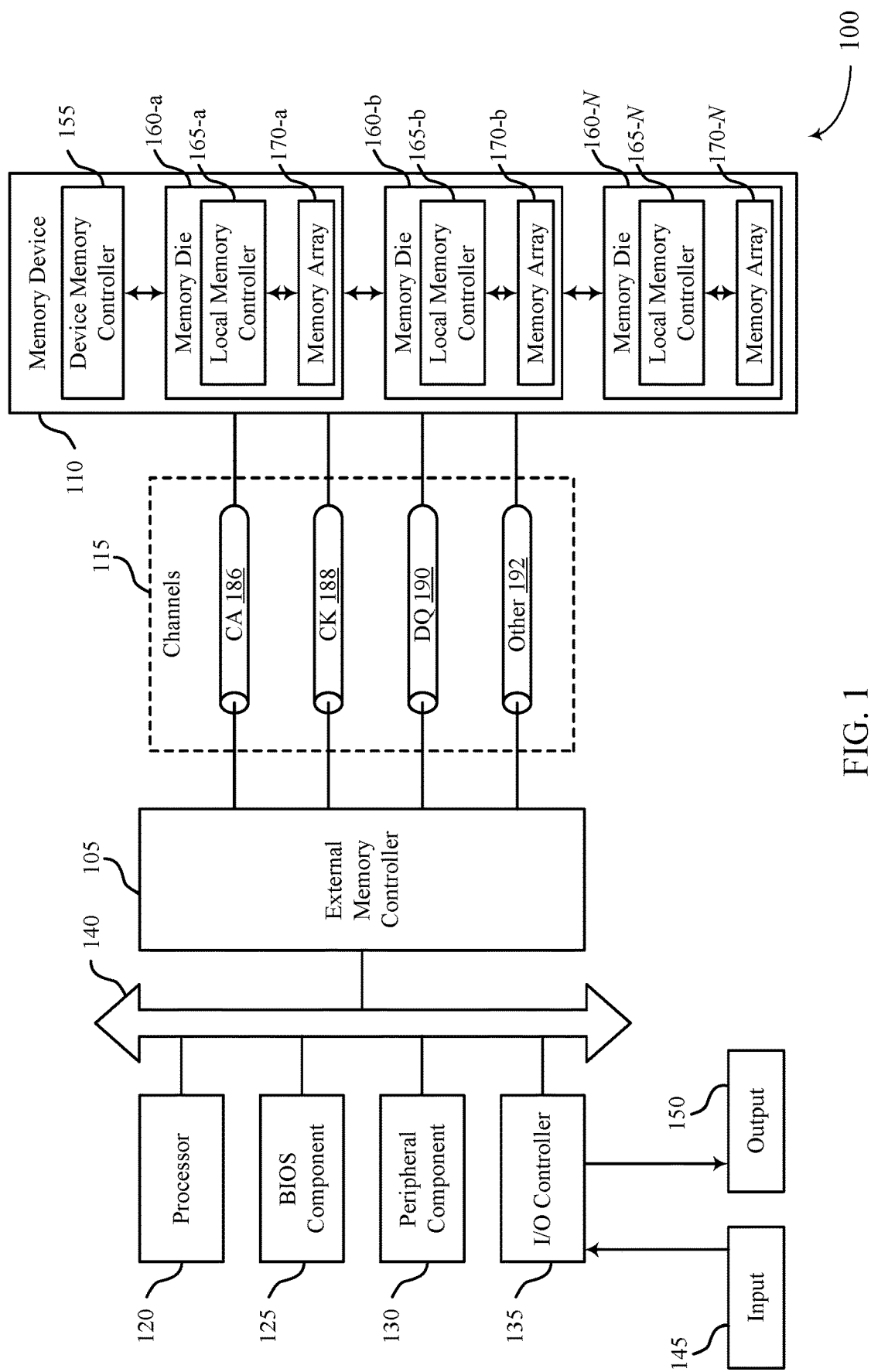
FIG. 1 illustrates an example of a memory array that supports refresh-related activation in memory as disclosed herein.

A logic state stored to a memory cell may be degraded or destroyed. To prevent the degradation of the logic state, data may be periodically refreshed, which in some cases may include reading from a memory cell and writing back (e.g., rewritten) to the same row without modification. This may be referred to as a refresh operation and may be used to preserve the integrity of the data stored in a respective row of volatile memory cells. In some examples, refresh operations may be used during operation of dynamic random-access memory (DRAM) memory cells. In some systems or devices, during a refresh operation, DRAM memory may remain idle for a defined time to ensure that the refresh operation completes and the information stored in the memory cell is preserved. This time period may be referred to as a row refresh time (e.g., tRFC) as specified in the Joint Electron Device Engineering Council (JEDEC) industry specification, as one example. As described herein, a memory device may in some cases be unable to execute one or more commands for the memory cells during this time period (e.g., during tRFC). For example, the memory device may be unable to execute an activate command, a read command, a write command, and/or one or more other commands (collectively referred to hereinafter as "access commands") during tRFC.

Accessing or energizing a row within a memory array may be referred to as opening a row or activating a row, which may allow columns having cells at the intersection with the row to be accessed. In some examples, it may be desirable to re-open one or more rows of memory cells after a refresh operation. Stated another way, certain memory operations may involve a row being activated before a refresh operation is issued and then subsequently being activated following (e.g., immediately following) the refresh operation. This may be referred to as re-opening a row of memory cells or re-opening a page of memory cells. Because an associated memory device may be unable to execute any access commands to the row (e.g., to the row of memory cells to be re-opened) during a defined time period, a memory device may experience an increase in power consumption and a decrease in available bandwidth after a refresh operation to re-open one or more memory cells and then execute other commands or perform other operations. Additionally or alternatively, a delay may exist between the end of the refresh operation and the time that the rows are re-opened (e.g., due to one or more row timing specifications). Stated another way, in some devices, after tRFC, the overall performance of the memory device may ordinarily decrease due to the issuance of multiple access commands (e.g., multiple activate commands) to re-open the memory cells and execute various operations. Thus it may be beneficial to leverage the duration between the end of the refresh operation and the time that one or more rows may be re-opened, while also decreasing the memory device's overall power consumption and increasing available bandwidth related to refresh. Improved techniques for leveraging this duration are desired.

As described herein, the duration following a refresh operation may be leveraged to re-open one or more rows of memory cells after a refresh operation. To leverage tRFC, the memory device may store information to be used later to facilitate more efficient operations. In some examples, this information may include one or more addresses (e.g., row addresses) associated with memory cells to be re-accessed after the refresh operation. By storing the addresses, the rows of memory cells associated with each address may be accessed (e.g., opened) following or relative to tRFC.

For example, a refresh command may be associated with particular rows of memory cells. An array of memory cells may include thirty-two (32) rows of memory cells and a refresh operation may be associated with, for example, sixteen (16) of the thirty-two rows. Thus, when a memory device receives a refresh command, it may determine which (if any) of the rows to be refreshed are currently open (e.g., if any of the sixteen rows are to be re-opened.) Assuming that one or more rows previously opened are to be refreshed, the memory device may, in some examples, close the rows and store each row's address (e.g., in a logic bank of the memory device). At a later time (e.g., after a start of or on completion of tRFC), at least some of the stored addresses may be accessed, and at least some of the associated rows of memory cells may be accessed (e.g., opened). In some cases, these rows may be accessed concurrently, simultaneously, serially, or in parallel. As described herein, opening each of the rows (e.g., at once) may reduce the timing associated with re-opening the rows that would otherwise be incurred by transmitting an individual access command to each row of memory cells.

In another example, tRFC may be leveraged based on the memory device receiving one or more commands (e.g., during the time period). For example, the memory device may receive one or more commands during a refresh operation. In some examples, the command may be an activate command (e.g., to open one or more pages of memory cells) or may be associated with a testing and/or diagnostic operation of one or more memory cells. As the memory device receives these commands (e.g., during tRFC), the commands may be stored (e.g., for use after the refresh operation). The commands may be performed (e.g., executed), in some cases after at least partial if not full completion of the refresh operation, which may reduce the timing otherwise associated with receiving and executing the commands after the refresh operation ends.

For example, a memory device may receive a refresh command and may determine which (if any) rows of memory cells are to be refreshed. The memory device may close the rows to be refreshed, and may receive commands (e.g., before and/or while the rows are being refreshed). As described herein, the commands may be associated with re-opening one or more rows of memory cells or, in some examples, may be associated with a command for entering a test mode of the memory device, among other examples. As the commands are received, the memory device may store each command. In some examples, the addresses may be stored to a logic bank of the memory device and, upon completion of tRFC, at least some if not each of the stored commands may be performed (e.g., executed). For example, an access command (e.g., an activate command) may be executed and each of the memory cells associated with the command addresses may be accessed (e.g., opened) following tRFC. By storing and subsequently performing the commands (after tRFC), the timing otherwise associated with receiving and executing the commands (e.g., after the refresh operation ends) may be reduced.

Features of the disclosure are initially described in the context of a memory system, a circuit, process flow diagrams, and apparatus diagrams with reference to FIGS. 1-6. These and other features of the disclosure are further illustrated by and described with reference to apparatus diagrams and flowcharts in FIGS. 7-11 that relate to refresh-related activation in memory.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an activate command for an activate operation (e.g., a row activate operation), a write command for a write operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

In some examples, the device memory controller 155 may be able to conduct one or more operations associated with a refresh operation as described herein. For example, the device memory controller 155 may be configured to receive (e.g., from a host device) and/or initiate a refresh operation associated with one or more elements of memory (e.g., rows of memory cells). During the one or more refresh operations (e.g., during tRFC), the device (e.g., memory controller 155) may be configured to store information, such as one or more row addresses (e.g., row addresses to be re-opened after a portion of a refresh operation is complete) and/or one or more commands received (e.g., a test mode command) from an external device. In some examples, after a time period (e.g., when the refresh operation is complete), the device (e.g., memory controller 155) may be configured to re-activate one or more rows of memory cells based on storing an associated row address, and/or may be configured to execute one or more saved commands.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

In some examples, the external memory controller 105 may be able to conduct one or more operations described above with reference to the device memory controller 155. For example, the external memory controller 105 may initiate a refresh operation on one or more rows of memory cells by transmitting a command (e.g., a refresh command) to the memory device 110. In some examples, the external memory controller may communicate with the device memory controller 155 to store one or more row addresses (e.g., row addresses to be re-opened after tRFC) and/or one or more commands received (e.g., a test mode command), or the device. In some examples, after the refresh operation is complete, the external memory controller 105 may communicate with the device memory controller 155 to re-activate one or more rows of memory cells based on storing an associated row address and/or execute one or more commands saved.

Additionally or alternatively, the memory device 110 (e.g., the device memory controller 155) may be able to conduct one or more operations described above without receiving explicit instructions from the external memory controller 105. For example, the device memory controller 155 may initiate a refresh operation on one or more rows of memory cells, store one or more row addresses, and re-activate one or more rows of memory cells based on storing an associated row address and/or execute one or more commands saved.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include multiple signal paths (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential signal (e.g., a CK_t signal and a CK_c signal) and the signal paths of the CK channels 188 may be configured accordingly. In some cases, the clock signal may be single ended. In some cases, the clock signal may oscillate at any frequency (e.g., 1.5 GHz). A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential signal (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
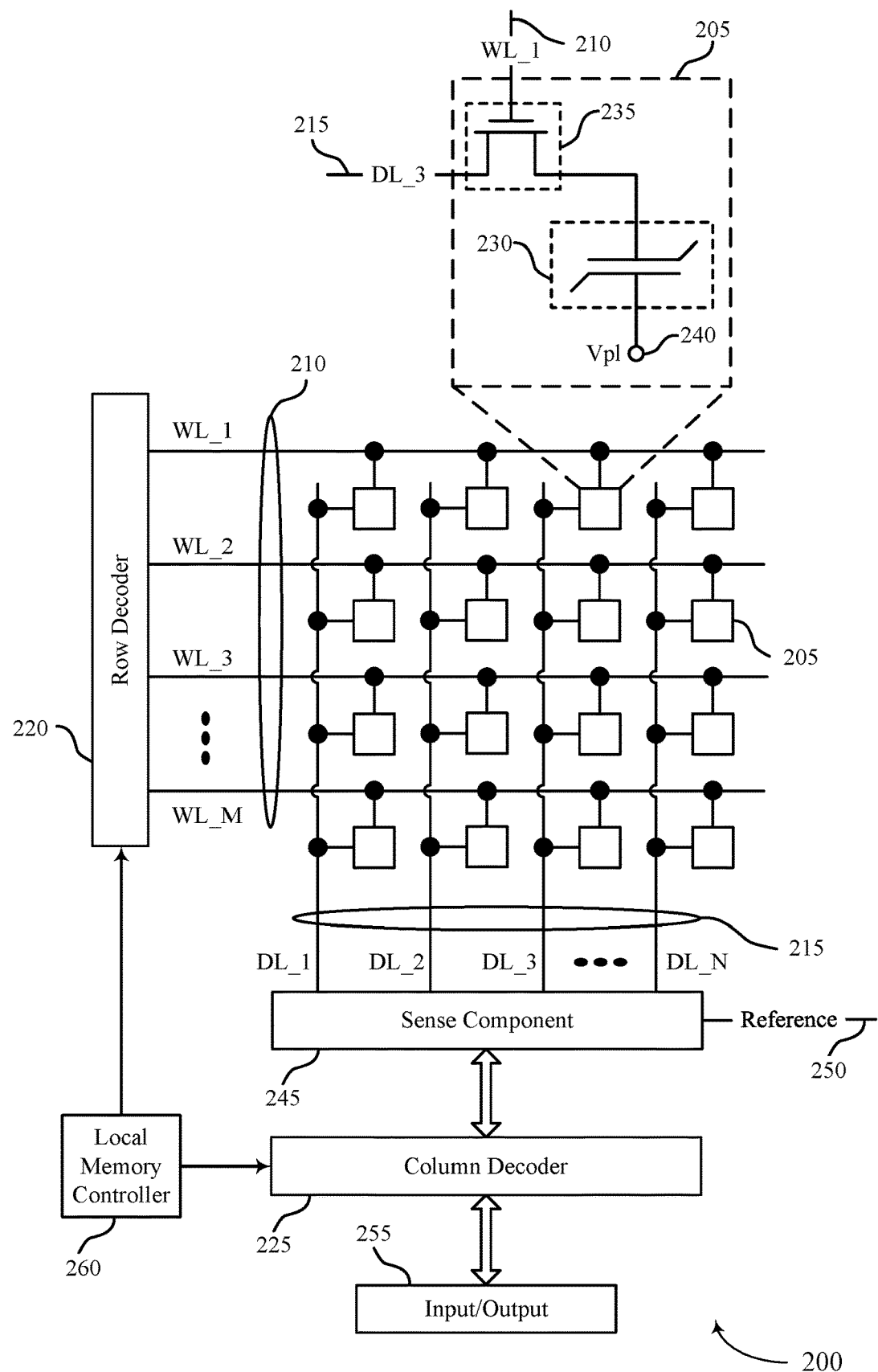
FIG. 2 illustrates an example of a circuit that supports refresh-related activation in memory as disclosed herein.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may select a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some examples, the local memory controller 260 may perform one or more operations described with reference to the device memory controller 155. For example, the local memory controller 260, as merely one example, may be configured to receive (e.g., from a host device) and/or initiate a refresh operation associated with a row of memory cells. During one or more refresh operations (e.g., during tRFC), the local memory controller 260 may be configured to store information including, but not limited to, one or more row addresses (e.g., row addresses to be re-opened after tRFC) and/or one or more commands received (e.g., a test mode command) from an external device. In some examples, after the refresh operation is complete, the local memory controller 260 may be configured to re-activate one or more rows of memory cells based on storing an associated row address, and/or may be configured to execute one or more saved commands.

In some cases, the local memory controller 260 may be configured to perform a precharge operation on the memory die 200. A precharge operation may comprise precharging one or more components and/or access lines of the memory die 200 to one or more determined voltage levels. In some instances, the memory cell 205 and/or portions of the memory die 200 may be precharged between different access operations. In some instances, the digit line 215 and/or other components may be precharged before a read operation. In some examples, as described herein, a precharge operation (e.g., a precharge command) may be configured to cause the closing of (or indicate to the local memory controller 260 to close) one or more rows of memory cells. By closing one or more rows of memory cells (e.g., during a precharge operation), each of the closed rows may be opened (e.g., simultaneously, concurrently, serially, or any combination thereof) following at least partial if not full completion of one or more refresh operations (e.g., those related to tRFC).

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed. As described herein, one or more row addresses and/or commands may be stored during a re-write operation. Accordingly, upon completion of the re-write, the rows corresponding to the stored addresses may be re-opened (e.g., re-opened at once) and/or the stored commands may be executed.

Figure 3:
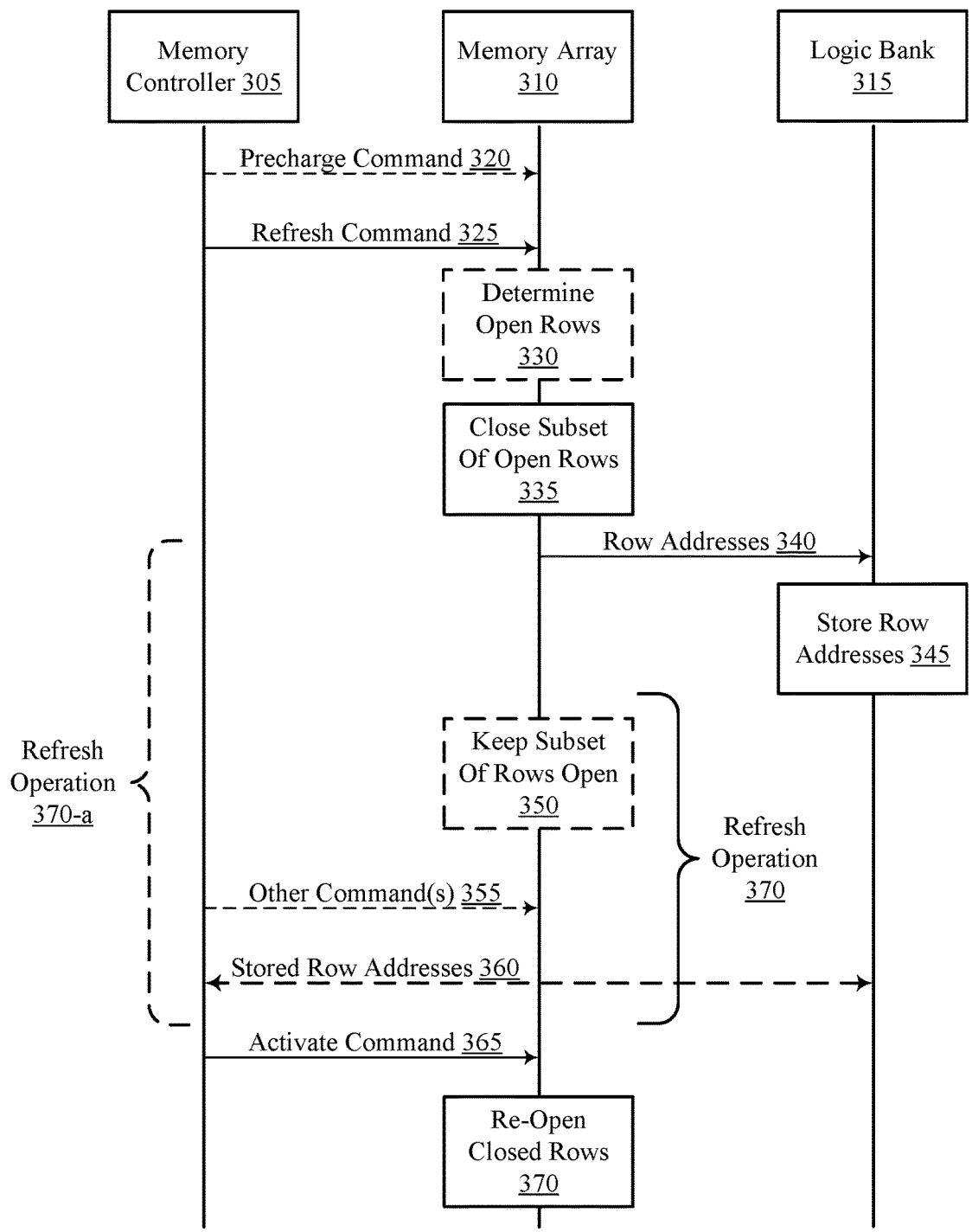
FIGS. 3 through 5 illustrate example process flow diagrams that support refresh-related activation in memory as disclosed herein.

FIG. 3 illustrates an example of a process flow 300 that supports refresh-related activation in memory as disclosed herein. The process flow 300 may implement aspects of the system 100 and memory sub-array 200. The process flow 300 may include operations performed by a memory controller 305, as one example, which may implement aspects of the external memory controller 105 or the device memory controller 155 as described with reference to FIG. 1. The process flow 300 may further include operations performed at a memory array 310, which may be an example of the memory array 170 (e.g., included in the memory device 110) or the memory sub-array 200 as described with reference to FIGS. 1 and 2. Additionally or alternatively, the process flow 300 may include one or more operations performed at a logic bank 315 (e.g., of a memory device). In some examples, the memory array 310 and logic bank 315 may be included in a same device (e.g., a memory device 110 as described with reference to FIG. 1). Additionally or alternatively, the memory controller 305 may be located external to a memory device that includes the memory array 310 and the logic bank 315, or may be co-located within a same device that includes the memory array 310 and the logic bank 315.

As disclosed herein, memory devices may conduct refresh operations on a row of memory cells (e.g., of the memory array 310) by, in some cases, reading data from the array and rewriting the data (e.g., to one or more locations, which may include the same row, without modification). Refresh operations may preserve the integrity of the data stored in the respective row of memory cells. Some memory cells (e.g., DRAM memory cells) may be configured to remain idle for a row refresh time (e.g., tRFC) to ensure that one or more refresh operations may be executed successfully (e.g., are complete). In some examples, the row refresh time may represent the duration of an idle period associated with a refresh operation of a memory device.

During the row refresh time, the memory device may store one or more addresses (e.g., row addresses) of memory cells to be re-accessed (or opened in the first instance) after the refresh operation so that the rows may be accessed (e.g., written to or read from) at once following the row refresh time. As described herein with reference to FIGS. 3 and 4, opening each of the rows of memory cells may reduce the timing associated with opening or re-accessing the memory cells, while decreasing the memory device's overall power consumption and increasing its available bandwidth.

In some examples (not shown) a precharge command issued at 320 and/or a refresh command issued at 325 may be issued based in part on one or more commands received from a host device. For example a host device may issue, to the memory controller 305, one or more messages (e.g., commands) associated with a refresh operation. For example, the host device may transmit a message to the memory controller indicating one or more addresses (e.g., of the memory array 310) to be refreshed.

In some examples, the row refresh time may be leveraged to re-open one or more rows of memory cells based on the issuance of a precharge command at 320. The row refresh time may, in some cases, be based on receiving one or more commands from a device (e.g., a host device), based on one or more operations performed by a memory device itself, or a combination thereof. In some examples, the precharge command issued at 320 may be issued by a memory controller 305 to the memory array 310. A precharge command may precharge one or more access lines of the memory array 310 to one or more predetermined voltage levels. In some examples, the precharge command issued at 320 may be issued to indicate (e.g., to the memory array 310) that one or more row addresses are to be stored during a refresh operation. Because a refresh command (e.g., refresh command issued at 325) may not be issued to an open row of memory cells, the precharge command may be issued to close one or more rows of memory cells of the memory array 310. Closing one or more open rows may subsequently allow for an address of the row to be saved, and for the row to be re-opened after the refresh operation (e.g., after tRFC).

In some examples, the precharge command issued at 320 may be transmitted to the memory array 310 independent from the refresh command issued at 325. In other examples, the refresh command issued at 325 may be configured to perform one or more aspects of the precharge command issued at 320. Stated another way, the precharge command issued at 320 may be "hidden" within the refresh command issued at 325, meaning that the refresh command may cause the memory device to close one or more rows of memory cells of the memory array 310. For example, the refresh command issued at 325 may cause the memory device to close one or more open rows, so that an address of each row may be saved, and so that the rows may be subsequently re-opened after the refresh operation (e.g., after tRFC).

In some examples, a precharge command may be associated with a precharge duration (e.g., a duration needed to precharge the associated memory cells). This duration may be referred to as tRP. By including (e.g., "hiding") the precharge command within the refresh command issued at 325, the duration associated with the refresh command (e.g., tRFC) may be adjusted (e.g., increased) by tRP. Including the precharge command within the refresh command may simplify one or more operations associated with one or more components of a memory device (e.g., it may simplify a state machine or operation), but may influence the duration (e.g., tRFC) until a row of memory cells may be opened or re-opened.

At 330, the open rows of the memory array 310 that are associated with the refresh command issued at 325 may be determined. The determination may be made, in some examples, by the memory controller 305. In some examples, the memory array 310 may include multiple banks. Each bank may be or may include a collection (e.g., a grid) of memory cells, with each memory cell being configured to store at least one bit of digital data. At any one time, at least some if not each bank may include multiple open rows. In some examples, a refresh operation may be associated with one or more rows of a particular section (e.g., a particular bank) of the memory array 310. To re-open the rows associated with the refresh operation (e.g., after tRFC), the rows of the particular section may be first closed, and a corresponding address may be saved (e.g., to the logic bank 315) for later reference. Alternatively, addresses of one or more open rows may be saved and then the rows may be closed.

In some examples, however, the memory array 310 may include one or more open rows that are not associated with the refresh operation (e.g., the open rows fall within a first section while the refresh operation is associated with one or more other sections). In some examples, as described herein, these unassociated open rows (e.g., unassociated with the refresh operation) may be maintained (e.g., remain) open during the row refresh time instead of being closed. In some systems, when a refresh operation is initiated all open rows in different sections or subsets of a memory array or die will be closed. As disclosed herein, however, some rows of a subset of the memory device that are different than those areas related to the refresh operation may be held open. Thus, at 330, a distinction may be made between open rows associated with the refresh command 325 and open rows unassociated with the refresh command 325. In some examples, the determination may be made by the memory controller 305 or a local device such as a memory controller (e.g., a local memory controller 260 as described with reference to FIG. 2), among other options.

In some examples, the memory array 310 may include multiple subsets of rows of memory cells. For example, the memory array 310 may include a first subset of memory cells and a second subset of memory cells. In some examples, each of the subsets of memory cells (e.g., the first subset and the second subset) may be non-overlapping. Stated another way, each subset of memory cells may be independent of the others. In another example, one or more memory cells of any one subset may included in another subset. For example, one or more rows of memory cells of the first subset of memory cells may be included in the second subset of memory cells.

At 335, at least a subset of the open rows may be closed. Stated another way, at 335 at least some if not all of the open rows associated with the refresh command 325 (e.g., and determined at 330) may be closed. In some examples, the rows may be closed by the memory controller 305 or a local device such as a memory controller (e.g., a local memory controller 260 as described with reference to FIG. 2).

An address (e.g., a row address) corresponding to each row (e.g., each closed row) may be communicated at 340 to the logic bank 315. In some cases, this may occur after closing the open rows associated with the refresh command 325. In some cases, this may occur before or during closing the open rows associated with the refresh command 325. In some examples, the one or more row addresses communicated at 340 may be communicated (e.g., to the logic bank 315) so that the one or more row addresses may be stored (e.g., saved). Stated another way, upon receiving the row addresses communicated at 340, the logic bank 315 may store the row addresses at 345.

In some examples, the row addresses communicated at 340 may be stored by one or more latch components at the logic bank 315. In other examples (not shown), the row addresses may be stored in other locations a memory device. For example, the row addresses may be stored to one or more rows of memory cells of the memory array 310. As described below with reference to FIGS. 5 and 6, the latch components may temporarily store the row addresses communicated at 340 (e.g., until at least some if not all of the refresh operation is complete, such as until the end of tRFC). After the refresh operation is complete, the word lines associated with the stored row addresses communicated at 340 may be activated to access the associated memory cells after the row refresh time. In some examples, the row addresses communicated at 340 may be indicated to and subsequently stored at the logic bank 315 by the memory controller 305 or a local device such as a memory controller (e.g., a local memory controller 260 as described with reference to FIG. 2).

In some examples, once the one or more row addresses are stored at the logic bank 315 (e.g., at 345), a refresh operation 370 may begin. In another example, as shown in FIG. 3, a refresh operation 370-a may begin before the row addresses are stored to the logic bank 315 (e.g., at 345). Refresh operation 370 may be or may indicate a same refresh operation as refresh operation 370-a beginning at a different time.

The refresh operation 370 may be initiated based on the memory array 310 receiving the precharge command 320 and/or the refresh command 325. Because the precharge command 320 and/or the refresh command 325 may indicate one or more row addresses to be refreshed (e.g., and potentially stored as disclosed herein) during a refresh operation, the command(s) may indicate for the refresh operation 370 to begin once the associated row addresses 340 are stored to the logic bank 315 (e.g., at 345). Thus as shown in FIG. 3, the refresh operation 370 (and tRFC) may begin immediately once the row addresses are stored to the logic bank 315.

At 350, a subset of the open rows unassociated with the refresh command 325 may remain open. As described herein (e.g., at 330), the memory array 310 may include one or more open rows that are not associated with the refresh operation. Accordingly, these rows may be kept open (e.g., maintained in an open state) (e.g., at 335) because they are not affected by the one or more refresh operations. Rather, they may remain open during this duration (e.g., during the duration of the refresh operation 370, such as during tRFC). Although the open rows may not be accessed during the row refresh time, in some cases, the opened rows do not need to be re-opened after the refresh operation 370. Thus by keeping the rows open (e.g., keeping the necessary circuitry energized to allow access to cells within the row) during the duration of the row refresh time, any timing associated with re-opening the memory cells may be mitigated. Additionally or alternatively, this may decrease the memory device's overall power consumption and increase its available bandwidth.

In some examples, the memory array 310 may receive one or more other commands, at 355, during the refresh operation 370, before or during the refresh operation 370, or any combination thereof. As described below with reference to FIG. 4, the other commands issued at 355 may include a command for entering a test mode of the memory array, a command for performing a ZQ calibration, a command for performing a Design for Testability (DFT) operation, a command to indicate that at least some if not all open row addresses are to be stored, a command to indicate that at least some if not all open row addresses are to be re-activated during or after the refresh operation, a command to indicate that at least some if not all open rows are to be saved and re-opened when the refresh operation concludes, or any combination thereof. In some examples, the commands may be stored (e.g., in the logic bank 315) during the refresh operation 370 (not shown) and then executed during a later portion of the refresh operation or after the refresh operation.

To re-open (or open) the rows of memory cells associated with the stored row addresses, the memory controller 305 may communicate with the logic bank 315 during the refresh operation 370. For example, the memory controller may receive an indication of the stored row addresses at 360 based on a communication transmitted from the memory controller 305 to the logic bank 315 (e.g., based on a request). The indication of the stored row addresses at 360 may inform the memory controller 305 of what rows to re-open (e.g., upon the completion of the refresh operation 370). In some examples, however, the memory controller 305 may be informed of what rows to re-open based on or in response to transmitting the precharge command 320 and/or the refresh command 325 to the memory array 310. Stated another way, by transmitting the precharge command 320 and/or the refresh command 325 to the memory array 310, the memory controller 305 may determine to re-open the rows after the row refresh time. In other examples (not shown), an indication of the stored row addresses at 360 may be transmitted to a local device such as a memory controller (e.g., a local memory controller 260 as described with reference to FIG. 2) and/or may be communicated between the local device and the memory controller 305.

After the refresh operation 370 ends, the rows of memory cells associated with the stored row addresses (e.g., at 345) may be re-opened. In some examples, the row may be re-opened based on a single command (e.g., a master command) transmitted from the memory controller 305 to the memory array 310 at 365. In some examples, the row may be re-opened based on multiple commands transmitted from the memory controller 305 to the memory array 310 or may be re-opened automatically based on a configured protocol or in response to a previous command or instructions. Because the memory controller 305 may be informed of what row addresses are stored at the logic bank 315 (e.g., either by transmitting the precharge command 320 and/or the refresh command 325, or by receiving the indication of the stored row addresses at 360), the memory controller 305 may be configured to re-open the rows with one command. As described herein, opening each of the rows at once may reduce the timing otherwise needed to re-open the rows on a row-by-row basis as well as incurring the time to initiate the different commands after the completion of the refresh period. Stated another way, by leveraging the row refresh time to store the row addresses of the rows to be re-opened, the rows may be re-opened immediately following the completion of the refresh operation 370. By refraining from transmitting an individual command to re-open each row, the memory device's overall power consumption may be reduced and its available bandwidth may be increased.

Figure 4:
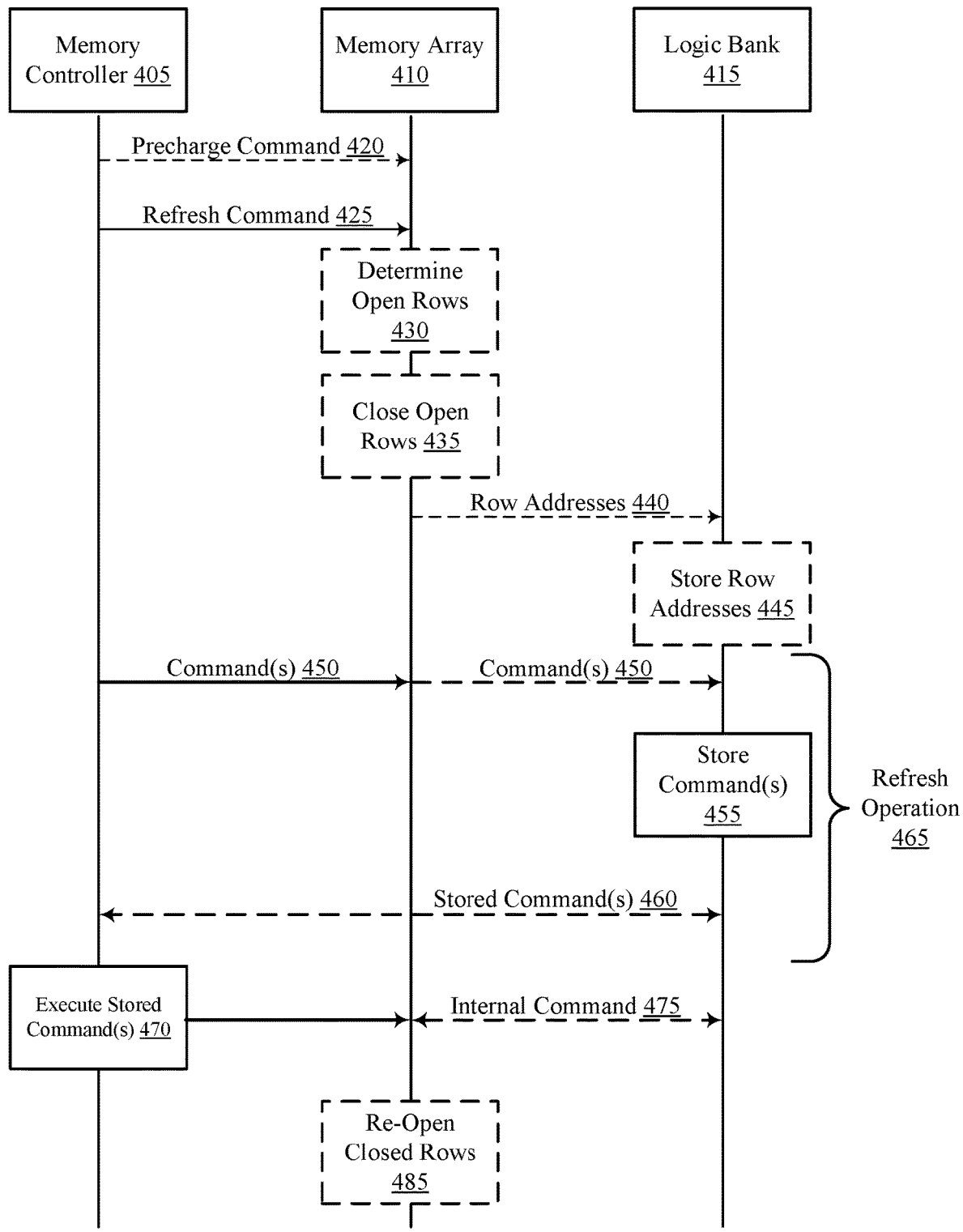

FIG. 4 illustrates an example of a process flow 400 that supports refresh-related activation in memory as disclosed herein. The process flow 400 may implement aspects of the system 100 and memory sub-array 200. The process flow 400 may include operations performed by a memory controller 405, as one example, which may implement aspects of the external memory controller 105 or the device memory controller 155 as described with reference to FIG. 1. The process flow 400 may further include operations performed at a memory array 410, which may be an example of the memory array 170 (e.g., included in the memory device 110) or the memory sub-array 200 as described with reference to FIGS. 1 and 2. Additionally or alternatively, the process flow 400 may include one or more operations performed at a logic bank 415 (e.g., of a memory device). In some examples, memory array 410 and logic bank 415 may be included in a same device (e.g., a memory device 110 as described with reference to FIG. 1). Additionally or alternatively, the memory controller 405 may be located external to a memory device that includes the memory array 410 and the logic bank 415, or may be co-located within a same device that includes the memory array 410 and the logic bank 415.

As disclosed herein, memory devices may conduct refresh operations on a row of memory cells (e.g., of the memory array 410) by, in some cases, reading data from the array and immediately rewriting the data (e.g., to one or more locations, which may include the same row, without modification). During the row refresh time, the memory device may receive one or more commands (e.g., the memory device may continue to receive commands) that may be stored and executed after the refresh operation is complete. As described herein with reference to FIG. 4, executing each of the saved commands (e.g., after the refresh operation is complete) may reduce the timing otherwise associated with executing the commands individually and at a later time, and may decrease the memory device's overall power consumption and increase its available bandwidth.

In some examples (not shown) a precharge command issued at 420 and/or a refresh command issued at 425 may be issued based in part on one or more commands received from a host device. For example a host device may issue, to the memory controller 405, one or more messages (e.g., commands) associated with a refresh operation. For example, the host device may transmit a message to the memory controller indicating one or more addresses (e.g., of the memory array 410) to be refreshed.

In some examples, the row refresh time may be leveraged to execute one or more saved commands upon the completion of the refresh operation. The commands may be associated with one or more rows of memory cells, which may be closed during the refresh operation based on the issuance of a precharge command at 420. In some examples, a precharge command at 420 may be issued by a memory controller 405 to the memory array 410. A precharge command at 420 may precharge one or more access lines of the memory array 410 to one or more predetermined voltage levels. In some examples, the precharge command may be issued to indicate (e.g., to the memory array 410) one or more row addresses to be closed (e.g., during a refresh operation) so that a command associated with the closed row may be executed (e.g., during or after the completion of the refresh operation).

In some examples, the precharge command issued at 420 may be transmitted to the memory array 410 independent from the refresh command issued at 425. In other examples, the refresh command may be configured to perform one or more aspects of the precharge command issued at 420. Stated another way, the precharge command issued at 420 may be "hidden" within the refresh command issued at 425, meaning that the refresh command may be configured to close one or more rows of memory cells of the memory array 410. For example, the refresh command issued at 425 may close one or more open rows, so that a command associated with the closed row may be executed after the refresh operation (e.g., after tRFC).

In some examples, a precharge command issued at 420 may be associated with a precharge duration (e.g., a duration needed to precharge the associated memory cells). This duration may be referred to as tRP. By including (e.g., "hiding") the precharge command within the refresh command, the duration associated with the refresh command issued at 425 (e.g., tRFC) may be adjusted (e.g., increased) by tRP. In some examples, including the precharge command within the refresh command issued at 425 may simplify one or more components of a memory device (e.g., it may simplify a state machine or operation), but may influence the duration (tRFC) until a row of memory cells may be re-opened.

At 430, the open rows of the memory array 410 that are associated with the refresh command 425 may be determined (e.g., before receiving a refresh command, after receiving a refresh command and before initiating a refresh operation, after receiving a refresh command and during a refresh operation). In some examples, the memory array 410 may include multiple banks. Each bank may be or may include a collection (e.g., a grid) of memory cells, with each memory cell being configured to store at least one bit of digital data. At any one time, each bank may include multiple open rows. In some examples, a refresh operation may be associated with rows of a particular section (e.g., a particular bank) of the memory array 410. To execute a command associated with a particular row of memory cells (e.g., after tRFC), the rows of the particular section may be closed. Thus, at 430, the rows of memory cells associated with a refresh operation may be determined so that they may subsequently be closed. In some examples, the determination may be made by the memory controller 405 or a local device such as a memory controller (e.g., a local memory controller 260 as described with reference to FIG. 2).

At 435, at least a subset of open rows associated with the refresh operation may be closed. Stated another way, at 435 at least some if not all of the open rows associated with the refresh command 425 (e.g., determined at 430) may be closed in order for an associated command to be executed after the refresh operation. In some examples, the rows may be closed by the memory controller 405 or a local device such as a memory controller (e.g., a local memory controller 260 as described with reference to FIG. 2).

An address (e.g., a row address) corresponding to each closed row may be communicated to the logic bank 415 at 440. In some examples, the row addresses communicated at 440 may be communicated to the logic bank 415 for storage. Stated another way, upon receiving the row addresses at 440, the logic bank 415 may store the row addresses at 445. In some cases, this may occur after closing the open rows associated with the refresh command issued at 425. In other cases, this may occur before or during closing the open rows associated with the refresh command issued at 425.

In some examples, the one or more row addresses communicated at 440 may be stored (e.g., by one or more latch components at the logic bank 415). In other examples (not shown), the row addresses may be stored in other locations a memory device. For example, the row addresses may be stored to one or more rows of memory cells of the memory array 410. As described below with reference to FIGS. 5 and 6, the latch components may temporarily store the row addresses communicated at 445 (e.g., until at least some if not all of the refresh operation is complete, such as until the end of tRFC). In some examples, the row addresses communicated at 440 may be indicated to and subsequently stored at the logic bank 415 by the memory controller 405 or a local device such as a memory controller (e.g., a local memory controller 260 as described with reference to FIG. 2).

In some examples, once the one or more row addresses are stored at the logic bank 415 (e.g., at 445), a refresh operation 465 may begin. The refresh operation 465 may be initiated based on the memory array 410 receiving the precharge command 420 and/or the refresh command 425. Because the precharge command 420 and/or the refresh command 425 may indicate one or more row addresses to be refreshed (e.g., and potentially stored as disclosed herein) during a refresh operation, the command(s) may initiate the refresh operation 465 after the row addresses are stored to the logic bank 415 (e.g., at 445). Thus as shown in FIG. 4, the refresh operation 465 (and tRFC) may begin immediately once the row addresses are stored to the logic bank 415.

In some examples, the memory array 410 may receive one or more commands at 450 during the refresh operation 465. The commands issued at 450 may include a command for entering a test mode of the memory array, a command for entering a test mode of the memory array, a command for performing a ZQ calibration, a command for performing a Design for Testability (DFT) operation, a command to indicate that at least some if not all open row addresses are to be stored, a command to indicate that at least some if not all open row addresses are to be re-activated during or after the refresh operation, a command to indicate that at least some if not all open rows are to be saved and re-opened when the refresh operation concludes, or any combination thereof. In some examples, at 450 the memory array 410 may receive any quantity of commands and may receive one or more commands relating to an access operation of the memory array 410. In some examples, the commands may be stored (e.g., in a logic bank 415 of a particular memory array associated with the received command) during the refresh operation 465 and then executed during a later portion of the refresh operation or after the refresh operation.

To execute the commands stored at the logic bank 415, the memory controller 405 may communicate with the logic bank 415 during the refresh operation 465. For example, the memory controller may receive an indication of an address of each stored command at 460 based on a communication transmitted from the memory controller 405 to the logic bank 415 (e.g., based on a request). The indication of the address of the stored command at 460 may inform the memory controller 405 of what commands to execute upon the completion of the refresh operation 465. In some examples, however, the memory controller 405 may be informed of what commands to execute based on transmitting the commands 450 to the memory array 410. In other examples (not shown), an indication of the stored commands at 460 may be transmitted to a local device such as a memory controller (e.g., a local memory controller 260 as described with reference to FIG. 2) and/or may be communicated between the local device and the memory controller 405.

After the refresh operation 465 ends, the stored commands (e.g., from 455) may be executed. In some examples, each of the commands may be executed based on a single command (e.g., a master command) transmitted from the memory controller 405 to the memory array 410. Because the memory controller 405 may be informed of what commands are stored at the logic bank 415 (e.g., either by transmitting the commands 450, or by receiving the indication of the stored commands at 460), the memory controller 405 may be configured to execute each of the stored commands by issuing a single command. In some examples, the memory controller 405 may issue a command to the memory array 410, which may generate and/or issue an internal command at 475 to execute the stored commands. As described herein, executing each of the stored commands at once may reduce the timing otherwise needed to execute the commands individually. Stated another way, by leveraging the row refresh time to store the received commands, the commands may be executed immediately following the completion of the refresh operation 465. By executing the commands at once using a single "master" command, the memory device's overall power consumption may be reduced and its available bandwidth may be increased.

In some examples, at 485, each of the rows of memory cells previously closed (e.g., at 435) may be re-opened. In some examples, each of the closed rows may be re-opened at once as described above with reference to FIG. 3. As described herein, re-opening each of the closed rows at once may decrease the memory device's overall power consumption and increase its available bandwidth.

Figure 5:
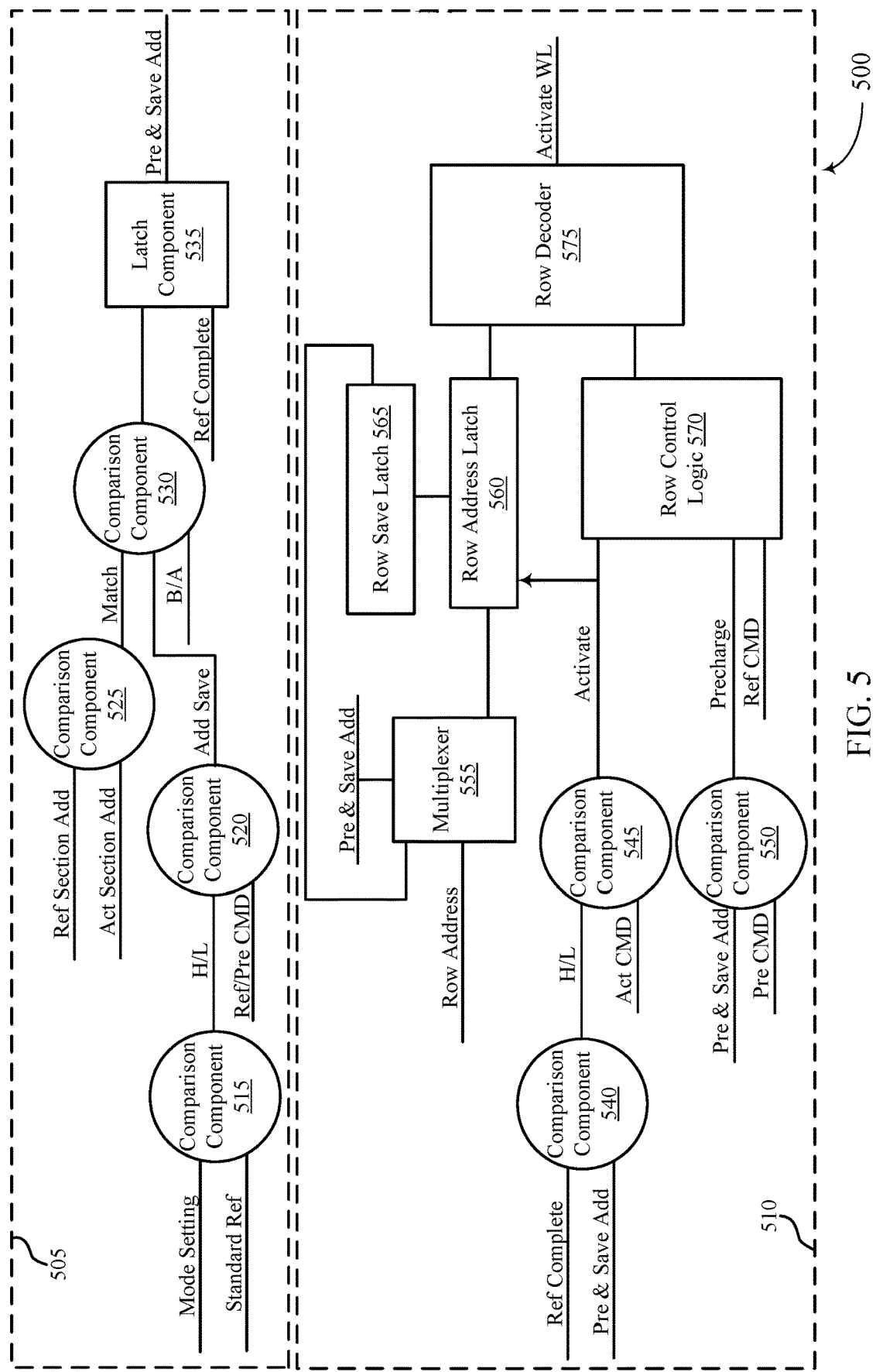

FIG. 5 illustrates an example of a row re-open component 500 in accordance with various examples of the present disclosure. The row re-open component 500 may conduct one or more operations (e.g., associated with, before, during, and/or after a refresh operation) as described with reference to FIG. 3. The row re-open component 500 may include a row address component 505 and a row activate component 510.

In some examples, the row address component 505 may be configured to store a row address of a row of memory cells to be re-opened after a refresh operation (e.g., after tRFC) as described with reference to FIG. 3. In some examples, the row address component 505 may include a comparison component 515, a comparison component 520, a comparison component 525, a comparison component 530, and a latch component 535.

Additionally or alternatively, the row activate component 510 may be configured to re-open a row of memory cells associated with an address stored by the row address component 505. In some examples, the row activate component 510 may include a comparison component 540, a comparison component 545, a comparison component 550, a multiplexer 555, a row address latch 560, a row save latch 565, a row control logic component 570, and a row decoder 575.

In some examples, the components of row re-open component 500 may be configured to operate with a memory array (e.g., a memory array 310 as described with reference to FIG. 3) and/or with a local memory controller (e.g., a local memory controller 260 as described with reference to FIG. 2) to conduct an refresh-related activation in memory as described herein.

The row re-open component 500 may include a row address component 505 that is configured to store a row address of a row of memory cells to be re-opened after a refresh operation (e.g., after tRFC). In some examples, the row address component 505 may include a comparison component 515, a comparison component 520, a comparison component 525, a comparison component 530, and a latch component 535. In some examples, each of the comparison components may be or include one or more digital logic gates such as an AND gate, an OR gate, an XNOR (e.g., an exclusive-nor) gate, or another logic device for comparing multiple input signals. The latch component 535 may be or include one or more digital logic devices such as a SR latch, a D latch, a T latch, a JK latch, or another logic device used for latching one or more input signals.

To store a row address of a row of memory cells to be re-opened after a refresh operation (e.g., after tRFC), the comparison component 515 may receive (e.g., be activated based on) a mode register signal (e.g., a Mode Setting signal) and/or a refresh signal (e.g., a Standard Ref signal). In some examples, the Mode Setting signal may indicate a particular mode that the memory device is operating in currently or that it should transition to. For example, the Mode Setting signal may indicate that the memory device is operating in a mode where one or more row addresses are to be stored and subsequently re-opened after a refresh operation. Additionally or alternatively, the Standard Ref signal may indicate that the memory device is in (or is about to enter) a refresh mode to conduct one or more refresh operations.

As described herein, the comparison component 515 may be or include one or more digital logic devices such as an AND gate or an OR gate. Depending on the type of logic device used, the comparison component 515 may output an output signal (e.g., a "high output" signal or a "low" output signal) based on one or more inputs. The signal may be or may be referred to as a H/L signal.

For example, the comparison component 515 may be an AND gate, and an output signal (e.g., a "high" output signal) may occur when the memory device is operating in a mode where one or more row addresses are to be stored and subsequently re-opened after a refresh operation and when the memory device is in (or is about to enter) a refresh mode to conduct one or more refresh operations. In some examples, the comparison component 515 may be an OR gate and may output a "high" signal when at least one of the two operating conditions described above are the same (e.g., true). Regardless of the type of logic device, the comparison component 515 may be configured to output a "high" signal when the device resides in a mode configured to store a row address of a row of memory cells to be re-opened after a refresh operation (e.g., after tRFC).

In some examples, the memory device may reside in a mode configured to store a row address of a row of memory cells to be re-opened after a refresh operation based on a mode selected by, for example, a mode register. The mode may be selected (e.g., by a mode register) as a default mode based on the memory device booting-up or based on one or more signals received, for example, by a host device.

In some examples, the comparison component 520 may be activated based on a "high" signal output from the comparison component 515 and/or a unique refresh/pre-charge command (e.g., a Ref/Pre CMD signal). In some examples, the Ref/Pre CMD signal may indicate that one or more rows of memory cells are configured to be closed during a refresh operation (e.g., based on one or more rows of memory cells being precharged). As described above with reference to FIGS. 3 and 4, a precharge command (e.g., a precharge command 320 as described with reference to FIG. 3) and/or a refresh command (e.g., a refresh command 325 as described with reference to FIG. 3) may be issued and that the associated rows may be subsequently re-opened after the refresh operation (e.g., after tRFC).

As described herein, the comparison component 520 may be or include one or more digital logic devices such as an AND gate or an OR gate. Depending on the type of digital logic device used, the comparison component 520 may output an output signal (e.g., a "high" output signal or a "low" output signal) based on one or more inputs. For example, the comparison component 520 may be an OR gate, and a "high" signal may be outputted when the memory device receives an output signal (e.g., a "high" output signal) from the comparison component 515 or a Ref/Pre CMD signal. For example, if the comparison component 520 receives a Ref/Pre CMD signal, then the comparison component 520 may output an address save signal (e.g., an Add Save signal) to indicate that one or more rows are to be closed and one or more row addresses are to be saved (e.g., saved to a logic bank) in that order or in the opposite order.

In another example, the comparison component 520 may be an AND gate and may output a "high" signal when both of the two operating conditions described above are the same (e.g., true). Regardless of the type of digital logic device, the comparison component 520 may be configured to output a "high" signal when the device resides in a mode configured to store a row address of a row of memory cells to be re-opened after a refresh operation (e.g., after tRFC).

In some examples, the comparison component 525 may receive inputs associated with various row addresses. For example, the comparison component 525 may receive a first input associated with a row address corresponding to a refresh operation (e.g., an address of a row to be refreshed). In some examples, this input may be referred to as a Ref Section Add signal. Additionally or alternatively, the comparison component 520 may receive a second input associated with an active row address (e.g., an address of a currently-active row). In some examples, this input may be referred to as an Act Section Add signal.

As described herein, the comparison component 525 may be or include one or more digital logic devices such as an XNOR gate. An XNOR gate may, for example, output a "high" signal when both of the inputs are the same (e.g., true, when both inputs match). Thus an output signal (e.g., a "high" output signal) from the comparison component 525 may be referred to as a Match signal. To trigger a Match signal, the row address corresponding to a refresh operation must match an active row address. Because the row address component 505 is configured to store a row address of a row of memory cells to be re-opened after a refresh operation, a Match signal may indicate a particular row to be closed (and its address stored) so that it may later be re-opened (e.g., after tRFC).

As described herein, the comparison component 530 may be or include one or more digital logic devices such as an AND gate. An AND gate may, for example, output a "high" signal when all of its inputs are the same (e.g., true). In some examples, the comparison component 530 may be activated based on a "high" signal output from both the comparison component 520 and the comparison component 525. As disclosed herein, a "high" signal output from the comparison component 520 may indicate that one or more row addresses are to be closed and saved, and a "high" signal output from the comparison component 525 may indicate a particular row to be closed (and its address stored) so that it may later be re-opened (e.g., after tRFC). Additionally or alternatively, the comparison component 530 may be activated based on a "high" signal output indicating that the particular bank associated with the Match signal is active (e.g., a B/A signal). Based on these inputs, the comparison component 530 may output a "high" signal to the latch component 535.

When the signal output from the comparison component 530 indicates that one or more row addresses are to be closed and saved, that a particular row to be closed (and its address stored), and that the corresponding bank is active, the latch component 535 may latch the corresponding row address. In some examples, the latch component 535 may receive an input corresponding to the refresh operation being complete (e.g., a Ref Complete signal). Accordingly, when the comparison component 530 outputs a "high" signal, the latch component 535 may latch the corresponding row address and output a signal indicating such (e.g., a Pre & Save Add signal).

The corresponding row address may be saved to, for example, a logic bank (e.g., a logic bank 315 as described with reference to FIG. 3) of a memory array (e.g., of memory array 310 as described with reference to FIG. 3). Conversely, a "high" Ref Complete signal may indicate that a corresponding refresh operation has ended. Thus if the latch component 535 receives a "high" Ref Complete signal before a "high" signal from the comparison component 530, the operations of the row address component 505 will end without saving an address of a row to be re-opened after the row refresh time.

As described herein, the row re-open component 500 may include a row activate component 510 that is configured to re-open a row of memory cells associated with an address stored by the row address component 505. In some examples, the row activate component 510 may include a comparison component 540, a comparison component 545, a comparison component 550, a multiplexer 555, a row address latch 560, a row save latch 565, a row control logic component 570, and a row decoder 575. In some examples, each of the comparison components may be or include one or more digital logic gates such as an AND gate, an OR gate, an XNOR (e.g., an exclusive-nor) gate, or a similar digital logic device used for comparing multiple input signals. The row address latch 560 and/or the row save latch 565 may be or include one or more digital logic devices such as a SR latch, a D latch, a T latch, a JK latch, or a similar digital logic device used for latching one or more input signals, and may be examples of latches located in one or more logic banks (e.g., logic bank 315 as described with reference to FIG. 3) of a memory array.

To re-open a row of memory cells associated with an address stored by the row address component 505, the comparison component 540 may be activated based on a Ref Complete signal and/or a Pre & Save Add signal. As described herein, a "high" Ref Complete signal may indicate that a corresponding refresh operation has at least partially if not fully ended. Additionally or alternatively, a "high" Pre & Save Add signal may indicate that a row address to be re-opened has been stored (e.g., to a logic bank) and that the row of memory cells has been closed.

As described herein, the comparison component 540 may be or include one or more digital logic devices such as an AND gate or an OR gate. Depending on the type of digital logic device used, the comparison component 540 may output an output signal (e.g., a "high" output signal or a "low" output signal (e.g., a H/L signal) based on one or more inputs. In some examples, the output signal may be or may be referred to as a H/L signal. For example, the comparison component 540 may be an AND gate, and an output signal (e.g., a "high" output signal) may occur when the memory device is operating in a mode where a refresh operation has ended and a row address to be re-opened has been stored and the row closed. Alternatively, in some examples, the comparison component 540 may be an OR gate and may output a "high" signal when at least one of the two operating conditions described above are true. Regardless of the type of digital logic device, the comparison component 540 may be configured to output a "high" signal to indicate that a row of memory cells associated with an address stored by the row address component 505 is to be re-opened.

In some examples, the comparison component 545 may be activated based on an output signal (e.g., a "high" output signal) from comparison component 540 and/or a "high" signal indicating that a particular row address is to be activated (e.g., an Act CMD signal). In some examples, as described herein, an Act CMD signal may be issued before a refresh operation, during a refresh operation, and/or after a refresh operation completes (e.g., after tRFC) and based on a particular address being precharged and saved. As described herein, the comparison component 545 may be or include one or more digital logic devices such as an AND gate or an OR gate. Depending on the type of digital logic device used, the comparison component 545 may output an output signal (e.g., a "high" output signal), such as an Activate signal, based on one or more inputs. An Activate signal may indicate, for example, that a particular row address has been saved and is to be re-opened. In some examples, the comparison component 540 may be an OR gate, and an output signal (e.g., a "high" output signal) may occur based on the output of the comparison component 540 being "high" or based on a signal indicating that a particular row address is to be activated.

Alternatively, in some examples, the comparison component 545 may be an AND gate and may output a "high" signal when both of the two operating conditions described above are the same (e.g., true). Regardless of the type of digital logic device, the comparison component 545 may be configured to output a "high" signal (e.g., to a row control logic component 570) to indicate that a particular latched row address is to be accessed.

In some examples, the comparison component 550 may be activated based on a Pre & Save Add signal and a precharge command signal (e.g., a Pre CMD signal). As described herein, a "high" Pre & Save Add signal may indicate that a row address to be re-opened has been stored (e.g., to a logic bank) and that the row of memory cells has been closed. Additionally or alternatively, a "high" Pre CMD signal may indicate that a precharge command (e.g., a precharge command 320 as described with reference to FIG. 3) has been issued.

The comparison component 540 may be or include one or more digital logic devices such as an AND gate or an OR gate. Depending on the type of digital logic device used, the comparison component 540 may output an output signal (e.g., a "high" output signal) or a "low" output signal (e.g., a Precharge signal) based on one or more inputs. For example, the comparison component 550 may be an OR gate, and an output signal (e.g., a "high" output signal) may occur when a row address to be re-opened has been stored and the row closed or when a precharge command has been issued. Alternatively, in some examples, the comparison component 550 may be an AND gate and may output a "high" signal when both of the two operating conditions described above are the same (e.g., true). Regardless of the type of digital logic device, the comparison component 550 may be configured to output a "high" signal (e.g., to a row control logic component 570) to indicate a precharge operation is to be conducted on the row of memory cells associated with the stored row address.

In some examples, when the comparison component 545 outputs an output signal (e.g., a "high" output signal), such as an Activate signal, then the row address latch 560 and/or the row save latch 565 may be activated. In some examples, the row save latch 565 may serve as an input to the multiplexer 555 and the row address latch 560 may serve as an output to the multiplexer 555. In other examples (not shown), the row address latch 560 and the row save latch 565 may be co-located within a same component, and a portion of the component may be utilized as an input for the multiplexer 555 and a portion of the component may be utilized as an output from the multiplexer 555.

As shown in FIG. 5, the Pre & Save Add signal may serve as a signal line to the multiplexer 555. In some examples, when the Pre & Save Add signal is "high" (e.g., indicating that a row address to be re-opened has been stored and closed), one of the inputs may be passed through the multiplexer 555 and to the row address latch 560. For example, if a row address has been stored and is to be re-opened, the corresponding address may be stored to the row save latch 565. Accordingly, the corresponding address may be passed from the multiplexer 555 to the row address latch 560. Additionally or alternatively, in some operations the Pre & Save Add signal may be "high" while an ordinary refresh operation occurs. Stated another way, during a single refresh operation some rows of memory cells may be precharged and re-opened, whereas others are only refreshed. Accordingly, when a row of memory cells is being refreshed, the corresponding row address may be passed from the multiplexer 555 to the row address latch 560 (e.g., based on the Row Address signal). In some examples, the associated address may be passed to the row decoder 575 to conduct a refresh operation.

As described herein, in some examples, a row address may have been stored to the row address latch 560 for re-opening. Stated another way, a particular address may have been stored by the row address component 505 for re-opening after the corresponding refresh operation. This address may have been passed from the row save latch 565, through the multiplexer 555, and stored to the row address latch 560. Concurrently, the row control logic component 570 may select between an Activate signal (e.g., indicating that a particular row address is to be re-opened), a precharge signal (e.g., indicating that a particular row address is to be precharged), or a refresh command signal (e.g., a Ref CMD signal indicating that a particular row address is to be refreshed), or any combination thereof. To re-open the address passed from the row save latch 565 to the row address latch 560 (e.g., the row address to be re-opened), the row control logic component 570 may select an Activate signal to pass to the row decoder 575 at a same time that the row address to be re-opened is passed from the row address latch 560 to the row decoder 575. In some examples, the row decoder 575 may output a signal indicating that a wordline associated with the row address to be re-opened is to be activated (e.g., an Activate WL signal).

In some examples, the row control logic component 570 may pass a Precharge signal and/or a Ref CMD signal to the row decoder 575. As described herein, during a single refresh operation some rows of memory cells may be precharged and re-opened, whereas others are only refreshed. Accordingly, when a row of memory cells is being refreshed, the corresponding row address may be passed from the row address latch 560 to the row decoder 575, and the row control logic component 570 may pass a Ref CMD signal to the row decoder 575 in order for a refresh operation to be conducted on the associated row of memory cells.

Figure 6:
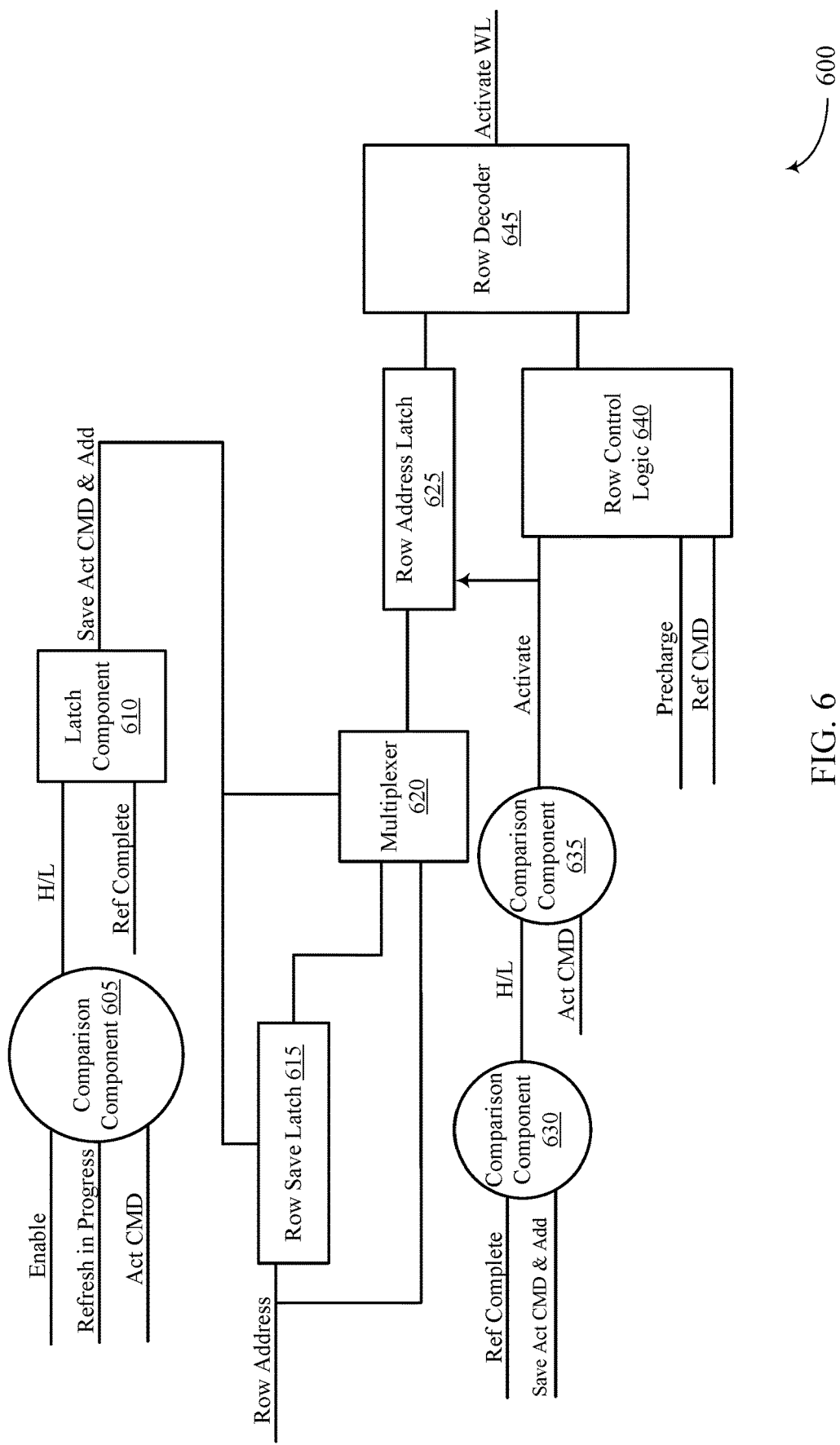
FIG. 6 illustrates an example of device that supports refresh-related activation in memory as disclosed herein.

FIG. 6 illustrates an example of a row open component 600 in accordance with various examples of the present disclosure. The row open component 600 may conduct one or more operations (e.g., associated with, before, during, and/or after a refresh operation) as described with reference to FIG. 4. The row open component 600 may be configured to receive one or more commands during a portion of a refresh operation and execute the commands after the refresh operation completes (e.g., after tRFC) as described with reference to FIG. 4. In some examples, the row open component 600 may include a comparison component 605, a latch component 610, a row save latch 615, a multiplexer 620, a row address latch 625, a comparison component 630, a comparison component 635, a row control logic component 640, and a row decoder 645. In some examples, the components of row open component 600 may operate with a memory array (e.g., a memory array 310 as described with reference to FIG. 3) and/or with a local memory controller (e.g., a local memory controller 260 as described with reference to FIG. 2) to conduct a refresh-related activation in memory as described herein.

The row open component 600 may be configured to receive one or more commands during a portion of a refresh operation and execute the commands after the refresh operation completes (e.g., after tRFC). In some examples, the row open component 600 may include a comparison component 605, a comparison component 630, and a comparison component 635. In some examples, each of the comparison components may be or include one or more digital logic gates such as an AND gate, an OR gate, an XNOR (e.g., an exclusive-nor) gate, or another logic device for comparing multiple input signals. The latch component 610 may be or include one or more digital logic devices such as a SR latch, a D latch, a T latch, a JK latch, or another logic device used for latching one or more input signals.

To receive one or more commands during a refresh operation and execute the commands after the refresh operation completes, the comparison component 605 may be activated based on a mode register signal (e.g., an Enable signal), a signal indicating that a refresh operation is in progress (e.g., a Refresh in Progress signal), and/or a miscellaneous command such as an activate command (e.g., an Act CMD).

In some examples, the Mode Setting signal may indicate a particular mode that the memory device is operating in. For example, the Mode Setting signal may indicate that the memory device is operating in a mode to receive one or more commands (e.g., before or during a refresh operation) and execute the commands (e.g., after the refresh operation at least partially if not fully completes). Additionally or alternatively, the Refresh in Progress Signal may indicate that the memory device is currently conducting a refresh operation on one or more rows of memory cells. The Act CMD may represent one or more miscellaneous commands received by the memory device during a refresh operation as described above with reference to FIG. 4. For example, the Act CMD may represent a memory device receiving a command for entering a test mode of the memory array, a command for performing a ZQ calibration, a command for performing a Design for Testability (DFT) operation, a command to indicate that at least some if not all open row addresses are to be stored, a command to indicate that at least some if not all open row addresses are to be re-activated during or after the refresh operation, a command to indicate that at least some if not all open rows are to be saved and re-opened when the refresh operation concludes, or any combination thereof.

As described herein, the comparison component 605 may be or may include one or more digital logic devices such as an AND gate or an OR gate. Depending on the type of digital logic device used, the comparison component 605 may output an output signal (e.g., a "high" output signal or a "low" output signal) based on one or more inputs. In some examples, the output signal may be referred to as a H/L signal. For example, the comparison component 605 may be an AND gate, and an output signal (e.g., a "high" output signal) may occur when the memory device is operating in a mode to receive one or more commands during a refresh operation and execute the commands after the refresh operation completes, when a refresh command is being conducted on one or more rows of memory cells, and when one or more commands are (or have been) received by the memory device. Or, in some examples, the comparison component 605 may be an OR gate and may output an output signal (e.g., "high" output signal) when at least one of the three operating conditions described above are true. Regardless of the type of digital logic device, the comparison component 605 may be configured to output a "high" signal when the device resides in a mode to receive one or more commands during a refresh operation and execute the commands after the refresh operation completes.

In some examples, the memory device may reside in a mode configured to receive one or more commands during a refresh operation and execute the commands after the refresh operation completes based on a mode selected by, for example, a mode register. The mode may be selected (e.g., by a mode register) as a default mode based on the memory device booting-up or based on one or more signals received, for example, by a host device.

When the signal output from the comparison component 605 indicates that the memory device has received one or more commands during a refresh operation (e.g., during an ongoing refresh operation), the latch component 610 may latch an address associated with the received command. Stated another way, the command may be stored to a particular address of a logic bank. In some examples, the latch component 610 may receive an input corresponding to the refresh operation being complete (e.g., a Ref Complete signal). Accordingly, when the comparison component 605 outputs a "high" signal, the latch component 610 may latch the corresponding row address and output a signal indicating such (e.g., a Save Act CMD & Add signal). The row address may correspond to a location of a logic bank (e.g., a logic bank 415 as described with reference to FIG. 4) where the associated command is saved. Conversely, a "high" Ref Complete signal may indicate that a corresponding refresh operation has ended. Thus if the latch component 610 receives a "high" Ref Complete signal before a "high" signal from the comparison component 605, the operations of the row open component 600 will end without saving an address of a command to be executed after the row refresh time.

In some examples, when the latch component 610 outputs a Save Act CMD & Add signal, the address corresponding to the received command may be saved to the row save latch 615. In some examples, the row save latch 615 may serve as an input to the multiplexer 620 and the row address latch 625 may serve as an output from the multiplexer 620. As shown in FIG. 6, the Save Act CMD & Add signal may serve as a signal line to the multiplexer 620. In some examples, when the Save Act CMD & Add signal is "high" (e.g., indicating that an address corresponding to the received command has been output from the latch component 610, one of the inputs may be passed through the multiplexer 620 and to the row address latch 625. For example, if an address of a command has been received during a refresh operation, the corresponding address may be stored to the row save latch 615. Accordingly, the corresponding address may be passed through the multiplexer 620 (e.g., from the row save latch 615) and to the row address latch 625.

Additionally or alternatively, in some operations the Save Act CMD & Add signal may be "high" while a refresh operation occurs. Stated another way, during a single refresh operation some commands may be received and subsequently saved, and certain rows of memory cells may be refreshed. Accordingly, when a row of memory cells is being refreshed, the corresponding row address may be passed through the multiplexer 620 to the row address latch 625 (e.g., based on the Row Address signal). In some examples, the associated address may be passed to the row decoder 645 to conduct a refresh operation.

In some examples, the comparison component 630 may be activated based on a Ref Complete signal and/or a Save Act CMD & Add signal. As described herein, a "high" Ref Complete signal may indicate that a corresponding refresh operation has ended. Additionally or alternatively, a "high" Pre & Save Add signal may indicate that an address corresponding to the received command has been output from the latch component 610.

As described herein, the comparison component 630 may be or include one or more digital logic devices such as an AND gate or an OR gate. Depending on the type of digital logic device used, the comparison component 630 may output an output signal (e.g., a "high" output signal or a "low" output signal) based on one or more inputs. In some examples, the output signal may be or may be referred to as a H/L signal. For example, the comparison component 630 may be an AND gate, and an output signal (e.g., a "high" output signal) may occur when the memory device is operating in a mode where a refresh operation has ended and an address corresponding to the received command has been output from the latch component 610. Alternatively, in some examples, the comparison component 630 may be an OR gate and may output a "high" signal when at least one of the two operating conditions described above are true. Regardless of the type of digital logic device, the comparison component 630 may be configured to output a "high" signal to indicate that a command received (and stored) during a refresh operation is to be executed.

In some examples, the comparison component 635 may be activated based on an output signal (e.g., a "high" output signal) from comparison component 630 and/or a "high" signal indicating that a particular address (e.g., of a received command) is to be activated. This may be referred to as an Act CMD signal. In some examples, as described herein, an Act CMD signal may be issued after a refresh completes (e.g., after tRFC) and based on a particular command address being saved to the row save latch 615 and/or row address latch 625. As described herein, the comparison component 635 may be or may include one or more digital logic devices such as an AND gate or an OR gate. Depending on the type of digital logic device used, the comparison component 635 may output an output signal (e.g., a "high" output signal), such as an Activate signal, based on one or more inputs. An Activate signal may indicate, for example, that a particular command address has been saved and is to be executed (e.g., after tRFC). In some examples, the comparison component 635 may be an OR gate, and an output signal (e.g., a "high" output signal) may occur based on the output of the comparison component 635 being "high" or based on a signal indicating that a particular address is to be activated. Alternatively, in some examples, the comparison component 635 may be an AND gate and may output a "high" signal when both of the two operating conditions described above are the same (e.g., true). Regardless of the type of digital logic device, the comparison component 635 may be configured to output a "high" signal (e.g., to a row control logic component 640) to indicate that a particular command (e.g., associated with a saved address) is to be executed.

As described herein, in some examples, a command received during a refresh operation may have been stored to the row address latch 625 for execution after the row refresh time. This command may have been passed from the row save latch 615, through the multiplexer 620, and stored to the row address latch 625. Concurrently, the row control logic component 640 may selective between an Activate signal (e.g., indicating that a particular row address is to be re-opened), a Precharge signal (e.g., indicating that a particular row address is to be precharged), or a refresh command signal (e.g., a Ref CMD signal indicating that a particular row address is to be precharged). To activate the address passed from the row save latch 615 to the row address latch 625 (e.g., of the command to be executed), the row control logic component 640 may select an Activate signal to pass to the row decoder 645 at a same time that the address of the command to be executed is passed from the row address latch 625 to the row decoder 645. In some examples, the row decoder 645 may output a signal indicating that a wordline associated with the stored command is to be activated (e.g., an Activate WL signal). Stated another way, the Activate WL signal may execute the command stored to the memory device.

In some examples, the row control logic component 640 may pass a Precharge signal and/or a Ref CMD signal to the row decoder 645. As described herein, during a single refresh operation some rows of memory cells may be refreshed during a time where commands are received (and later executed). Accordingly, when a row of memory cells is being refreshed, the corresponding row address may be passed from the row address latch 625 to the row decoder 645, and the row control logic component 640 may pass a Ref CMD signal to the row decoder 645 in order for a refresh operation to be conducted on the associated row of memory cells.

Figure 7:
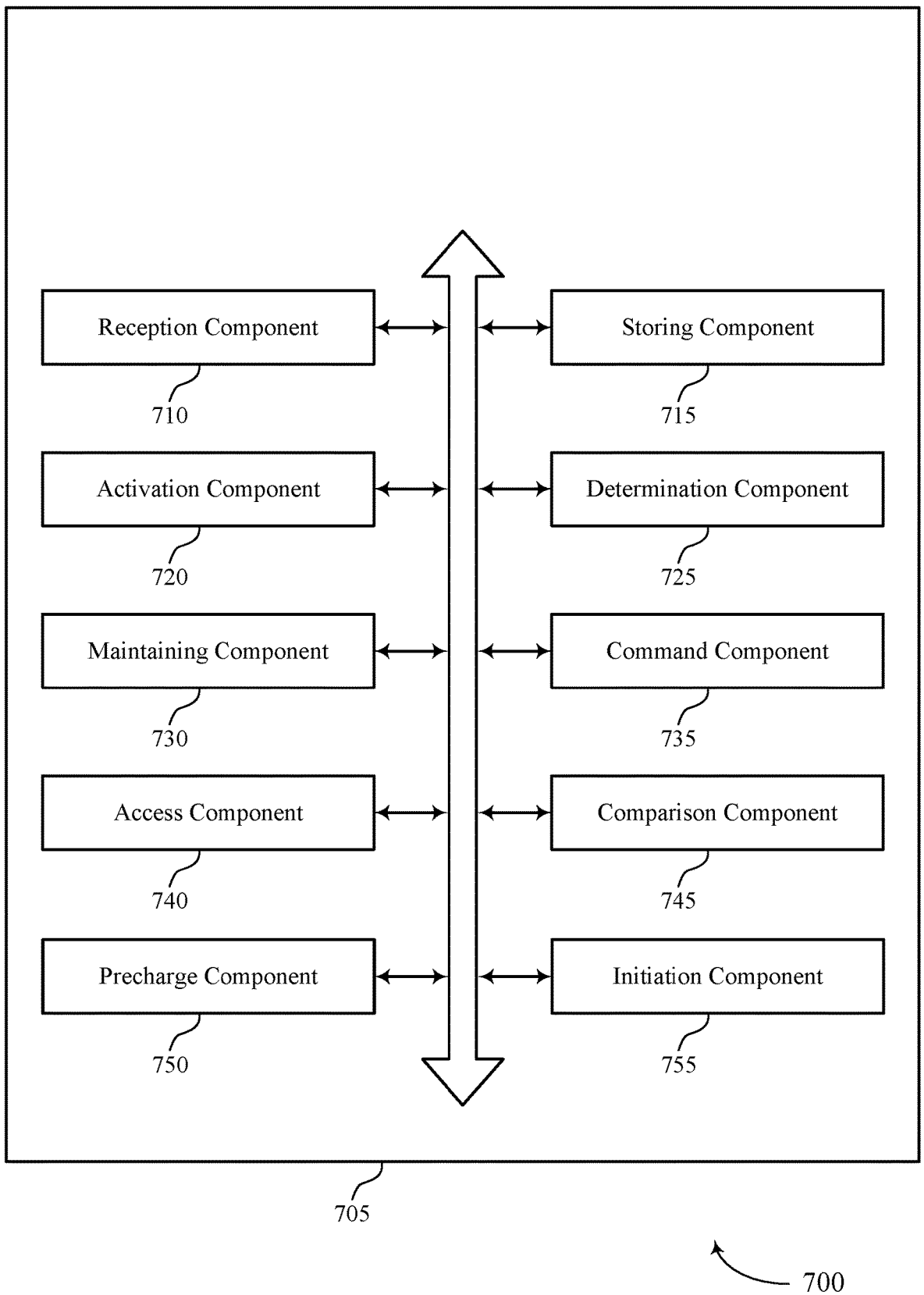
FIG. 7 shows a block diagram of a refresh command component that supports refresh-related activation in memory as disclosed herein.

FIG. 7 shows a block diagram 700 of a refresh command component 705 that supports refresh-related activation in memory as disclosed herein. The refresh command component 705 may perform one or more aspects of a refresh-related activation as described with reference to FIGS. 3 through 6. In some examples, the refresh command component 705 may be or may include elements of local memory controller 260, row decoder 220, column decoder 225, sense component 245, or other logic of the memory die 200 as described with reference to FIG. 2. The refresh command component 705 may include a reception component 710, a storing component 715, an activation component 720, a determination component 725, a maintaining component 730, a command component 735, an access component 740, a comparison component 745, a precharge component 750, and an initiation component 755. Each of these modules may communicate, directly or indirectly, with one another (e.g., via one or more buses).

The reception component 710 may receive, at a memory array including a set of rows of memory cells, a refresh command for a first row of memory cells of the set. In some examples, the reception component 710 may receive, at a memory array including a set of rows of memory cells, a command during a refresh operation associated with the memory array. In some examples, the reception component 710 may receive, at a memory array including a first subset of rows of memory cells and a second subset of rows of memory cells, a refresh command for the first subset of rows of memory cells. In some examples, the reception component 710 may receive, at the memory array, a second refresh command for a second row of memory cells.

In some examples, the reception component 710 may receive, before receiving the command, a refresh command that is associated with the refresh operation, where storing the command is based on receiving the refresh command. In some examples, the reception component 710 may receive, at the memory array, a command during the refresh operation.

The storing component 715 may store a row address of a second row of memory cells of the plurality based on receiving the refresh command. In some examples, the storing component 715 may store the command during the refresh operation. In some examples, the storing component 715 may store the row address of the second row of memory cells in a logic bank during a duration of the refresh operation. In some examples, the storing component 715 may store the row address before a start of the refresh operation that is associated with the refresh command.

In some examples, the storing component 715 may store a second row address for a third row of memory cells based on receiving the second refresh command. In some examples, the storing component 715 may store the command during the refresh operation in a logic bank that is associated with a subset of rows of the set. In some examples, the storing component 715 may store the second command during the refresh operation. In some examples, the storing component 715 may store a row address of the first subset of rows of memory cells based on receiving the refresh command. In some examples, the storing component 715 may store the command during the refresh operation.

The activation component 720 may activate, based on storing the row address, the second row of memory cells associated with the stored row address of a refresh operation that is associated with the refresh command. In some examples, the activation component 720 may activate the second row of memory cells after the duration of the refresh operation. In some examples, the activation component 720 may activate, based on storing the second row address, the third row of memory cells associated with the second row address. In some examples, the activation component 720 may activate the second row of memory cells automatically in response to an end of the refresh operation.

In some examples, the activation component 720 may activate, based on storing the row address, at least one row of memory cells of the set based on performing the command. In some examples, the activation component 720 may activate, based on storing the row address, the first subset of rows of memory cells after the refresh operation, where accessing the at least one memory cell is based on activating the first subset of rows of memory cells. In some examples, the activation component 720 may activate at least one row of the first subset of rows or the second subset of rows after the refresh operation.

The determination component 725 may determine that the row address of the second row of memory cells is open when the refresh command is received, where storing the row address of the second row of memory cells is based at least in part on determining that the row address is open. In some examples, the determination component 725 may determine that the command is associated with an active row of memory cells during the refresh operation, where performing the command during the refresh operation is based on determining that the command is associated with the active row.

The maintaining component 730 may keep the second subset of rows of memory cells open during a refresh operation associated with the refresh command. In some examples, the maintaining component 730 may keep at least one row of memory cells of the set open during the refresh operation.

The command component 735 may perform, based on storing the command during the refresh operation, the command during or after the refresh operation. In some examples, the command component 735 may perform, based on storing the second command during the refresh operation, the second command after the refresh operation. In some examples, the command component 735 may perform, based on storing the command during the refresh operation, the command after the refresh operation.

The access component 740 may close the first subset of rows of memory cells based on receiving the refresh command, where activating the at least one memory cell of the first subset of rows or the second subset of rows after the refresh operation is based on closing the first subset of rows.

The comparison component 745 may compare a row address of the first subset of rows of memory cells to a row address of the second subset of rows of memory cells based on receiving the refresh command, where keeping the second subset of rows of memory cells is based on comparing the row address of the first subset of rows to the row address of the second subset of rows.

The precharge component 750 may precharge a subset of the plurality of rows of memory cells.

The initiation component 755 may initiate the refresh operation that is associated with the refresh command based at least in part on precharging the subset of the plurality of rows. In some examples, the subset may include the first row of memory cells of the plurality and less than all of the plurality of rows of memory cells.

Figure 8:
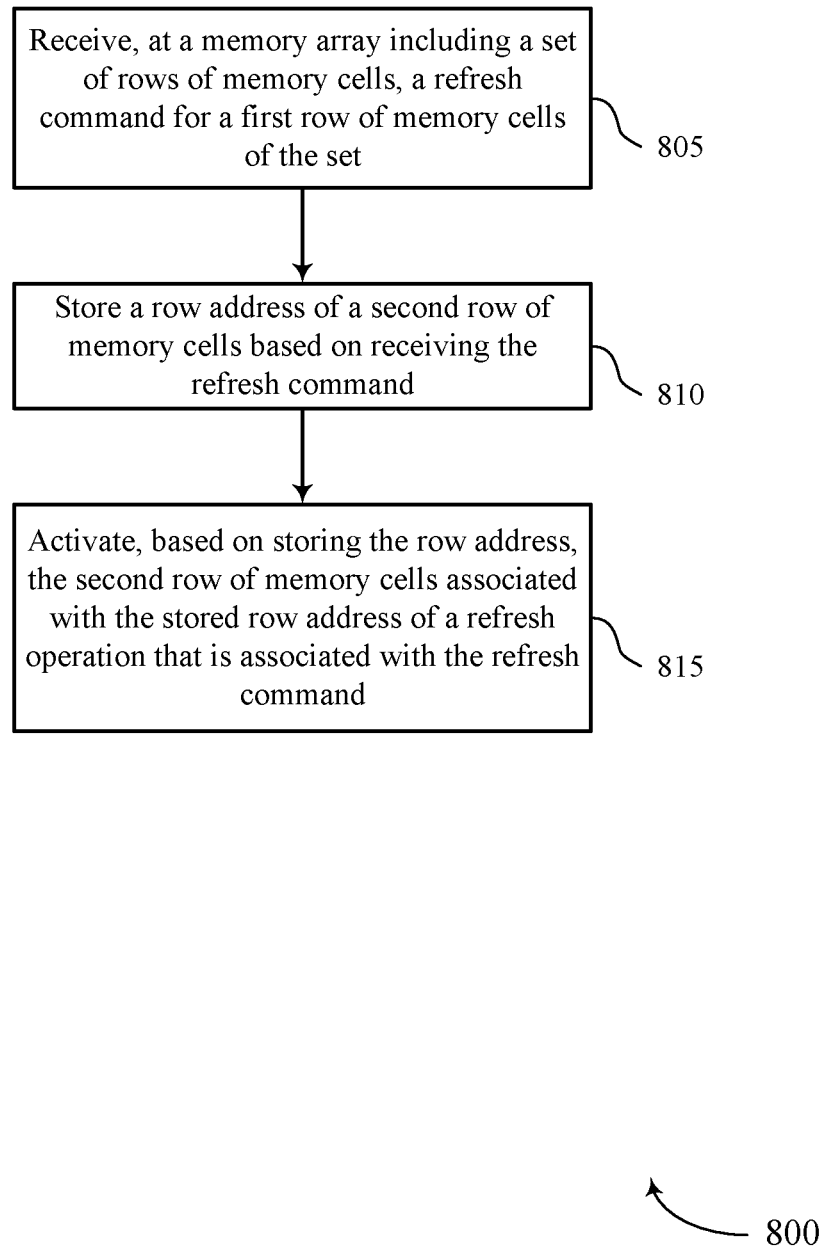
FIGS. 8 through 11 show flowcharts illustrating a method or methods that support refresh-related activation in memory as disclosed herein.

FIG. 8 shows a flowchart illustrating a method 800 that supports refresh-related activation in memory as disclosed herein. The operations of method 800 may be implemented by a memory controller or its components as described herein. For example, the operations of method 800 may be performed by a refresh command component as described with reference to FIG. 7. In some examples, a memory controller may execute a set of instructions to control the functional elements of the memory array to perform the described functions. Additionally or alternatively, a memory controller may perform aspects of the described functions using special-purpose hardware.

At 805, the memory array may receive a refresh command for a first row of memory cells of the set. In some examples, the memory array may include a set of rows of memory cells. The operations of 805 may be performed according to the methods described herein. In some examples, aspects of the operations of 805 may be performed by a reception component as described with reference to FIG. 7.

At 810, the memory array may store a row address of a second row of memory cells of the plurality based on receiving the refresh command. The operations of 810 may be performed according to the methods described herein. In some examples, aspects of the operations of 810 may be performed by a storing component as described with reference to FIG. 7.

At 815, the memory array may activate, based on storing the row address, the second row of memory cells associated with the stored row address of a refresh operation that is associated with the refresh command. The operations of 815 may be performed according to the methods described herein. In some examples, aspects of the operations of 815 may be performed by an activation component as described with reference to FIG. 7.

In some examples, an apparatus as described herein may perform a method or methods, such as method 800. The apparatus may include features, means, or instructions (e.g., a non-transitory computer-readable medium storing instructions executable by a processor) for receiving, at a memory array comprising a plurality of rows of memory cells, a refresh command for a first row of memory cells of the plurality, storing a row address of a second row of memory cells of the plurality based at least in part on receiving the refresh command, and activating, based at least in part on storing the row address, the second row of memory cells associated with the stored row address of a refresh operation that is associated with the refresh command.

Some examples of the methods, apparatuses, and non-transitory computer-readable medium described herein may further include operations, features, means, or instructions for determining that the row address of the second row of memory cells is open when the refresh command is received, wherein storing the row address of the second row of memory cells is based at least in part on determining that the row address is open.

Some examples of the methods, apparatuses, and non-transitory computer-readable medium described herein may further include operations, features, means, or instructions for precharging a subset of the plurality of rows of memory cells and initiating the refresh operation that is associated with the refresh command based at least in part on precharging the subset of the plurality of rows, wherein the subset comprises the first row of memory cells of the plurality and less than all of the plurality of rows of memory cells.

Some examples of the methods, apparatuses, and non-transitory computer-readable medium described herein may further include operations, features, means, or instructions for storing the row address of the second row of memory cells in a logic bank during a duration of the refresh operation.

In some examples of the methods, apparatuses, and non-transitory computer-readable medium described herein, the duration comprises a subset of clock cycles of the refresh operation.

Some examples of the methods, apparatuses, and non-transitory computer-readable medium described herein may further include operations, features, means, or instructions for activating the second row of memory cells after the duration of the refresh operation.

Some examples of the methods, apparatuses, and non-transitory computer-readable medium described herein may further include operations, features, means, or instructions for storing the row address before a start of the refresh operation that is associated with the refresh command.

Some examples of the methods, apparatuses, and non-transitory computer-readable medium described herein may further include operations, features, means, or instructions for storing a second row address for a third row of memory cells based at least in part on receiving the second refresh command, and activating, based at least in part on storing the second row address, the third row of memory cells associated with the second row address.

In some examples of the methods, apparatuses, and non-transitory computer-readable medium described herein, the second row of memory cells and the third row of memory cells are activated simultaneously.

In some examples of the methods, apparatuses, and non-transitory computer-readable medium described herein, the third row of memory cells is activated before an end of the refresh operation.

Some examples of the methods, apparatuses, and non-transitory computer-readable medium described herein may further include operations, features, means, or instructions for keeping at least one row of memory cells of the plurality open during the refresh operation.

In some examples of the methods, apparatuses, and non-transitory computer-readable medium described herein, activating the second row of memory cells occurs automatically in response to an end of the refresh operation.

Figure 9:
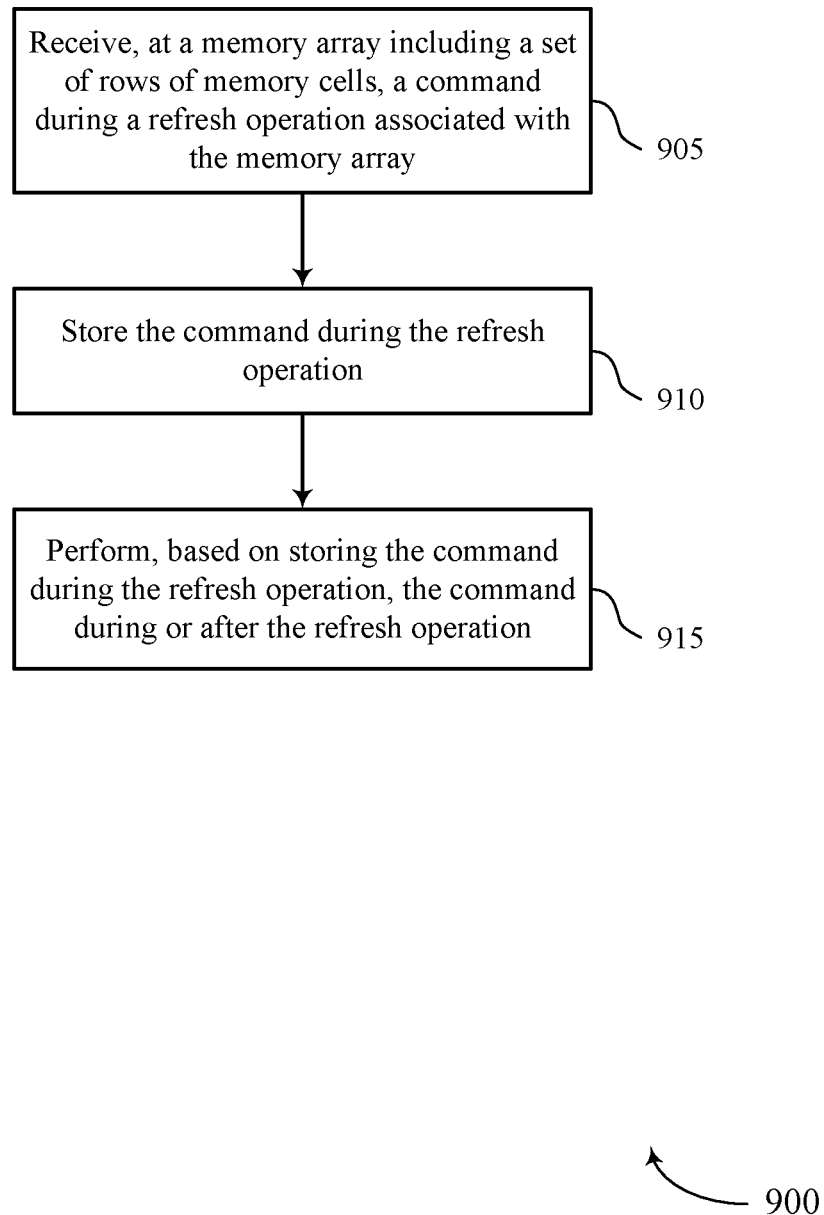

FIG. 9 shows a flowchart illustrating a method 900 that supports refresh-related activation in memory as disclosed herein. The operations of method 900 may be implemented by a memory controller or its components as described herein. For example, the operations of method 900 may be performed by a refresh command component as described with reference to FIG. 7. In some examples, a memory controller may execute a set of instructions to control the functional elements of the memory array to perform the described functions. Additionally or alternatively, a memory controller may perform aspects of the described functions using special-purpose hardware.

At 905, the memory array may receive a command during a refresh operation associated with the memory array. In some examples, the memory array may include a set of rows of memory cells. The operations of 905 may be performed according to the methods described herein. In some examples, aspects of the operations of 905 may be performed by a reception component as described with reference to FIG. 7.

At 910, the memory array may store the command during the refresh operation. The operations of 910 may be performed according to the methods described herein. In some examples, aspects of the operations of 910 may be performed by a storing component as described with reference to FIG. 7.

At 915, the memory array may perform, based on storing the command during the refresh operation, the command during or after the refresh operation. The operations of 915 may be performed according to the methods described herein. In some examples, aspects of the operations of 915 may be performed by a command component as described with reference to FIG. 7.

In some examples, an apparatus as described herein may perform a method or methods, such as method 900. The apparatus may include features, means, or instructions (e.g., a non-transitory computer-readable medium storing instructions executable by a processor) for receiving, at a memory array comprising a plurality of rows of memory cells, a command during a refresh operation associated with the memory array, storing the command during the refresh operation, and performing, based at least in part on storing the command during the refresh operation, the command during or after the refresh operation.

Some examples of the methods, apparatuses, and non-transitory computer-readable medium described herein may further include operations, features, means, or instructions for activating, based at least in part on storing the command, at least one row of memory cells of the plurality based at least in part on performing the command.

Some examples of the methods, apparatuses, and non-transitory computer-readable medium described herein may further include operations, features, means, or instructions for receiving, before receiving the command, a refresh command that is associated with the refresh operation, wherein storing the command is based at least in part on receiving the refresh command.

In some examples of the methods, apparatuses, and non-transitory computer-readable medium described herein, the refresh command comprises an indication of a duration of the refresh operation, wherein the command is stored during the duration based at least in part on the indication.

Some examples of the methods, apparatuses, and non-transitory computer-readable medium described herein may further include operations, features, means, or instructions for storing the command during the refresh operation in a logic bank that is associated with a subset of rows of the plurality.

Some examples of the methods, apparatuses, and non-transitory computer-readable medium described herein may further include operations, features, means, or instructions for receiving, at the memory array, a second command during the refresh operation, storing the second command during the refresh operation, performing, based at least in part on storing the second command during the refresh operation, the second command after the refresh operation.

In some examples of the methods, apparatuses, and non-transitory computer-readable medium described herein, the command comprises a command for entering a test mode of the memory array, a command for performing a ZQ calibration, a command for performing a Design for Testability (DFT) operation, a command to indicate that at least some if not all open row addresses are to be stored, a command to indicate that at least some if not all open row addresses are to be re-activated during or after the refresh operation, a command to indicate that at least some if not all open rows are to be saved and re-opened when the refresh operation concludes, or any combination thereof.

Some examples of the methods, apparatuses, and non-transitory computer-readable medium described herein may further include operations, features, means, or instructions for determining that the command is associated with an active row of memory cells during the refresh operation, wherein performing the command during the refresh operation is based at least in part on determining that the command is associated with the active row.

Figure 10:
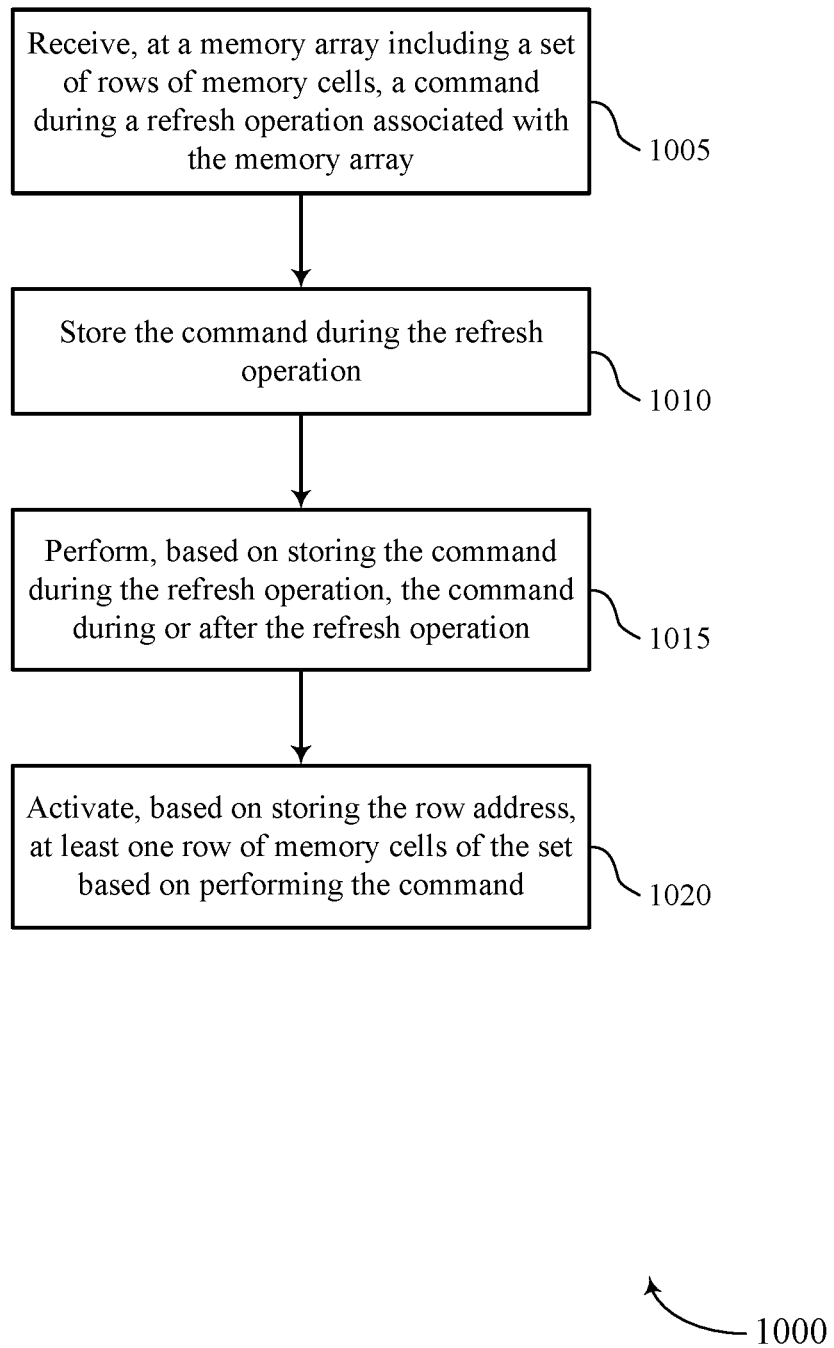

FIG. 10 shows a flowchart illustrating a method 1000 that supports refresh-related activation in memory as disclosed herein. The operations of method 1000 may be implemented by a memory controller or its components as described herein. For example, the operations of method 1000 may be performed by a refresh command component as described with reference to FIG. 7. In some examples, a memory controller may execute a set of instructions to control the functional elements of the memory array to perform the described functions. Additionally or alternatively, a memory controller may perform aspects of the described functions using special-purpose hardware.

At 1005, the memory array may receive a command during a refresh operation associated with the memory array. In some examples, the memory array may include a set of memory cells. The operations of 1005 may be performed according to the methods described herein. In some examples, aspects of the operations of 1005 may be performed by a reception component as described with reference to FIG. 7.

At 1010, the memory array may store the command during the refresh operation. The operations of 1010 may be performed according to the methods described herein. In some examples, aspects of the operations of 1010 may be performed by a storing component as described with reference to FIG. 7.

At 1015, the memory array may perform, based on storing the command during the refresh operation, the command during or after the refresh operation. The operations of 1015 may be performed according to the methods described herein. In some examples, aspects of the operations of 1015 may be performed by a command component as described with reference to FIG. 7.

At 1020, the memory array may activate, based on storing the row address, at least one row of memory cells of the set based on performing the command. The operations of 1020 may be performed according to the methods described herein. In some examples, aspects of the operations of 1020 may be performed by an activation component as described with reference to FIG. 7.

Figure 11:
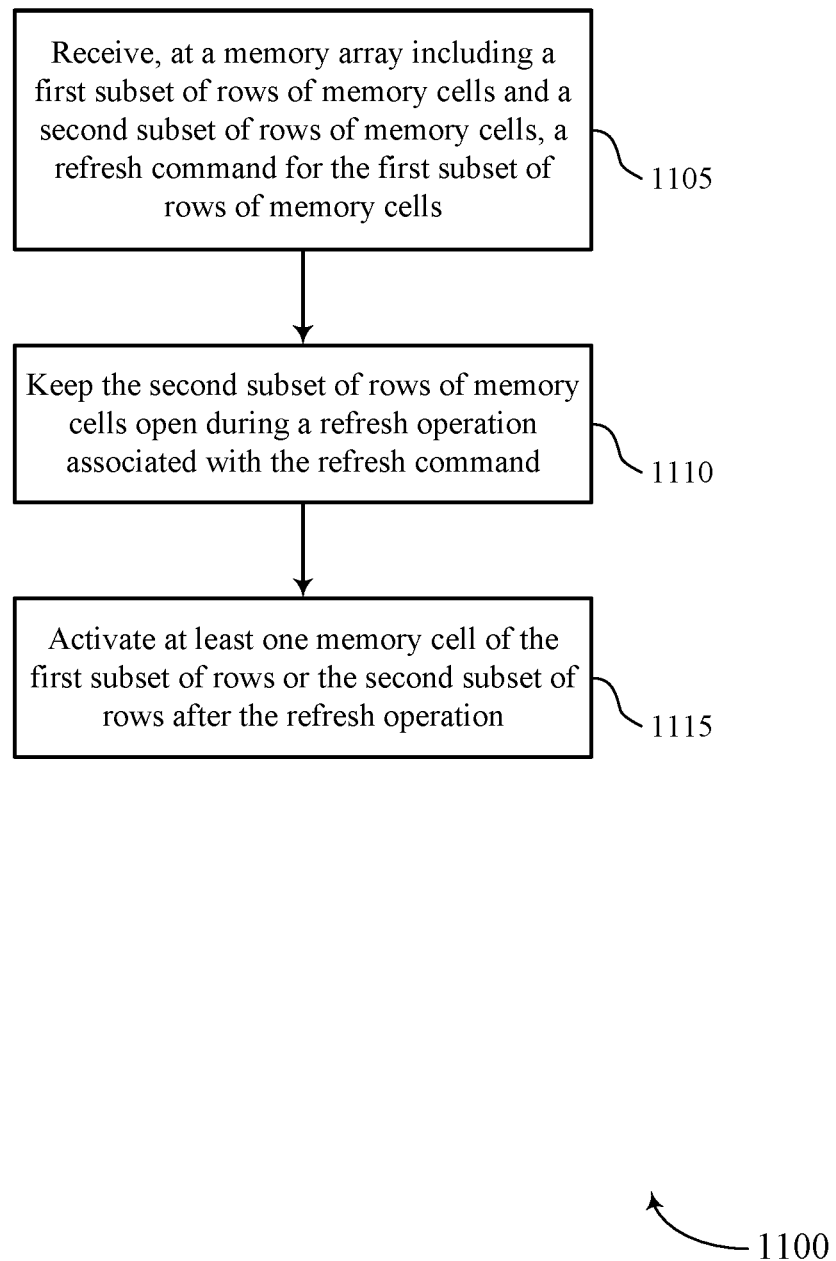

FIG. 11 shows a flowchart illustrating a method 1100 that supports refresh-related activation in memory as disclosed herein. The operations of method 1100 may be implemented by a memory controller or its components as described herein. For example, the operations of method 1100 may be performed by a refresh command component as described with reference to FIG. 7. In some examples, a memory controller may execute a set of instructions to control the functional elements of the memory array to perform the described functions. Additionally or alternatively, a memory controller may perform aspects of the described functions using special-purpose hardware.

At 1105, the memory array may receive a refresh command a refresh command for the first subset of rows of memory cells. In some examples, the memory array may include a first subset of rows of memory cells and a second subset of rows of memory cells. The operations of 1105 may be performed according to the methods described herein. In some examples, aspects of the operations of 1105 may be performed by a reception component as described with reference to FIG. 7.

At 1110, the memory array may keep the second subset of rows of memory cells open during a refresh operation associated with the refresh command. The operations of 1110 may be performed according to the methods described herein. In some examples, aspects of the operations of 1110 may be performed by a maintaining component as described with reference to FIG. 7.

At 1115, the memory array may activate at least one memory cell of the first subset of rows or the second subset of rows after the refresh operation. The operations of 1115 may be performed according to the methods described herein. In some examples, aspects of the operations of 1115 may be performed by an access component as described with reference to FIG. 7.

In some examples, an apparatus as described herein may perform a method or methods, such as method 1100. The apparatus may include features, means, or instructions (e.g., a non-transitory computer-readable medium storing instructions executable by a processor) for receiving, at a memory array comprising a first subset of rows of memory cells and a second subset of rows of memory cells, a refresh command for the first subset of rows of memory cells, keeping the second subset of rows of memory cells open during a refresh operation associated with the refresh command, and activating at least one memory cell of the first subset of rows or the second subset of rows after the refresh operation.

Some examples of the methods, apparatuses, and non-transitory computer-readable medium described herein may further include operations, features, means, or instructions for comparing a row address of the first subset of rows of memory cells to a row address of the second subset of rows of memory cells based at least in part on receiving the refresh command, wherein keeping the second subset of rows of memory cells is based at least in part on comparing the row address of the first subset of rows to the row address of the second subset of rows.

Some examples of the methods, apparatuses, and non-transitory computer-readable medium described herein may further include operations, features, means, or instructions for closing the first subset of rows of memory cells based at least in part on receiving the refresh command, wherein activating the at least one memory cell of the first subset of rows or the second subset of rows after the refresh operation is based at least in part on closing the first subset of rows.

Some examples of the methods, apparatuses, and non-transitory computer-readable medium described herein may further include operations, features, means, or instructions for storing a row address of the first subset of rows of memory cells based at least in part on receiving the refresh command and activating, based at least in part on storing the row address, the first subset of rows of memory cells after the refresh operation, wherein accessing the at least one memory cell is based at least in part on activating the first subset of rows of memory cells.

In some examples of the methods, apparatuses, and non-transitory computer-readable medium described herein, at least one memory cell of the second subset of rows of memory cells is accessed during the refresh operation.

Some examples of the methods, apparatuses, and non-transitory computer-readable medium described herein may further include operations, features, means, or instructions for receiving, at the memory array, a command during the refresh operation, storing the command during the refresh operation, and performing, based at least in part on storing the command during the refresh operation, the command after the refresh operation.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
receiving, at a memory array comprising a plurality of rows of memory cells, a refresh command for a first row of memory cells of the plurality;
storing a row address of a second row of memory cells of the plurality in a logic bank during a duration of a refresh operation based at least in part on receiving the refresh command; and
activating, based at least in part on storing the row address, the second row of memory cells associated with the stored row address of the refresh operation that is associated with the refresh command.

2. A method, comprising:
receiving, at a memory array comprising a plurality of rows of memory cells, a refresh command for a first row of memory cells of the plurality;
determining that a row address of a second row of memory cells is open when the refresh command is received;
storing the row address of the second row of memory cells of the plurality based at least in part on receiving the refresh command and based at least in part on determining that the row address is open; and
activating, based at least in part on storing the row address, the second row of memory cells associated with the stored row address of a refresh operation that is associated with the refresh command.

3. A method, comprising:
receiving, at a memory array comprising a plurality of rows of memory cells, a refresh command for a first row of memory cells of the plurality;
storing a row address of a second row of memory cells of the plurality based at least in part on receiving the refresh command;
precharging a subset of the plurality of rows of memory cells;
initiating a refresh operation that is associated with the refresh command based at least in part on precharging the subset of the plurality of rows of memory cells, wherein the subset comprises the first row of memory cells of the plurality and less than all of the plurality of rows of memory cells; and
activating, based at least in part on storing the row address, the second row of memory cells associated with the stored row address of the refresh operation that is associated with the refresh command.

4. The method of claim 1, wherein the duration comprises a subset of clock cycles of the refresh operation.

5. The method of claim 1, further comprising:
activating the second row of memory cells after the duration of the refresh operation.

6. A method, comprising:
receiving, at a memory array comprising a plurality of rows of memory cells, a refresh command for a first row of memory cells of the plurality;
storing a row address of a second row of memory cells of the plurality based at least in part on receiving the refresh command, wherein the row address is stored before a start of a refresh operation that is associated with the refresh command; and
activating, based at least in part on storing the row address, the second row of memory cells associated with the stored row address of the refresh operation that is associated with the refresh command.

7. The method of claim 1, further comprising:
storing a second row address for a third row of memory cells based at least in part on receiving the refresh command; and
activating, based at least in part on storing the second row address, the third row of memory cells associated with the second row address.

8. The method of claim 7, wherein the second row of memory cells and the third row of memory cells are activated simultaneously.

9. The method of claim 7, wherein the third row of memory cells is activated before an end of the refresh operation.

10. A method, comprising:
receiving, at a memory array comprising a plurality of rows of memory cells, a refresh command for a first row of memory cells of the plurality;
storing a row address of a second row of memory cells of the plurality based at least in part on receiving the refresh command;
keeping at least one row of memory cells of the plurality open during a refresh operation; and
activating, based at least in part on storing the row address, the second row of memory cells associated with the stored row address of the refresh operation that is associated with the refresh command.

11. The method of claim 1, wherein:
activating the second row of memory cells occurs automatically in response to an end of the refresh operation.

12. A method, comprising:
receiving, at a memory array comprising a plurality of rows of memory cells, a command during a refresh operation associated with the memory array;
storing the command during the refresh operation; and
performing, based at least in part on storing the command during the refresh operation, the command during or after the refresh operation.

13. The method of claim 12, further comprising:
activating, based at least in part on storing the command, at least one row of memory cells of the plurality based at least in part on performing the command.

14. The method of claim 12, further comprising:
receiving, before receiving the command, a refresh command that is associated with the refresh operation, wherein storing the command is based at least in part on receiving the refresh command.

15. The method of claim 14, wherein the refresh command comprises an indication of a duration of the refresh operation, wherein the command is stored during the duration based at least in part on the indication.

16. The method of claim 12, further comprising:
storing the command during the refresh operation in a logic bank that is associated with a subset of rows of the plurality.

17. The method of claim 12, further comprising:
receiving, at the memory array, a second command during the refresh operation;

storing the second command during the refresh operation; and performing, based at least in part on storing the second command during the refresh operation, the second command after the refresh operation.

18. The method of claim 12, wherein the command comprises a command for activating a row of memory cells of the memory array, a command for entering a test mode of the memory array, a command for performing a ZQ calibration, a command for performing a Design for Testability (DFT) operation, a command to indicate that all open row addresses are to be stored, a command to indicate that all open row addresses are to be re-activated during or after the refresh operation, a command to indicate that all open rows are to be saved and re-opened when the refresh operation concludes, or any combination thereof.

19. The method of claim 12, further comprising:

determining that the command is associated with an active row of memory cells during the refresh operation, wherein performing the command during the refresh operation is based at least in part on determining that the command is associated with the active row.

20. A method, comprising:

receiving, at a memory array comprising a first subset of rows of memory cells and a second subset of rows of memory cells, a refresh command for the first subset of rows of memory cells;

keeping the second subset of rows of memory cells open during a refresh operation associated with the refresh command; and activating at least one memory cell of the first subset of rows or the second subset of rows after the refresh operation.

21. The method of claim 20, further comprising:

comparing a row address of the first subset of rows of memory cells to a row address of the second subset of rows of memory cells based at least in part on receiving the refresh command, wherein keeping the second subset of rows of memory cells is based at least in part on comparing the row address of the first subset of rows to the row address of the second subset of rows.

22. The method of claim 20, further comprising:

closing the first subset of rows of memory cells based at least in part on receiving the refresh command, wherein activating the at least one memory cell of the first subset of rows or the second subset of rows after the refresh operation is based at least in part on closing the first subset of rows.

23. The method of claim 20, further comprising:

storing a row address of the first subset of rows of memory cells based at least in part on receiving the refresh command; and activating, based at least in part on storing the row address, the first subset of rows of memory cells after the refresh operation, wherein accessing the at least one memory cell is based at least in part on activating the first subset of rows of memory cells.

24. The method of claim 20, wherein the at least one memory cell of the second subset of rows of memory cells is accessed during the refresh operation.

25. The method of claim 20, further comprising:

receiving, at the memory array, a command during the refresh operation;

storing the command during the refresh operation; and performing, based at least in part on storing the command during the refresh operation, the command after the refresh operation.

* * * * *